(12) United States Patent
Suwa et al.

(10) Patent No.: US 8,897,018 B2
(45) Date of Patent: Nov. 25, 2014

(54) DISPLAY DEVICE AND TELEVISION RECEIVER

(75) Inventors: Kenichi Suwa, Osaka (JP); Daisaku Kiguchi, Osaka (JP); Takeshi Nishii, Osaka (JP); Junichi Takeuchi, Osaka (JP); Yuhsuke Ebata, Osaka (JP); Hitoshi Hasegawa, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/885,336

(22) PCT Filed: Nov. 29, 2011

(86) PCT No.: PCT/JP2011/077494
§ 371 (c)(1),
(2), (4) Date: May 14, 2013

(87) PCT Pub. No.: WO2012/073943
PCT Pub. Date: Jun. 7, 2012

(65) Prior Publication Data
US 2013/0235277 A1   Sep. 12, 2013

(30) Foreign Application Priority Data

Nov. 29, 2010 (JP) .................................. 2010-265552
Jun. 30, 2011 (JP) .................................. 2011-145879
Nov. 7, 2011 (JP) .................................. 2011-243646

(51) Int. Cl.
| H05K 7/00 | (2006.01) |
| H05K 5/02 | (2006.01) |
| G02F 1/1333 | (2006.01) |
| H04N 5/64 | (2006.01) |
| G02F 1/13 | (2006.01) |

(52) U.S. Cl.
CPC ............ H05K 5/0221 (2013.01); G02F 1/1309 (2013.01); G02F 1/133308 (2013.01); H04N 5/64 (2013.01); G02F 2201/465 (2013.01)
USPC ........................ 361/728; 361/681; 361/679.01

(58) Field of Classification Search
USPC .............................. 361/728, 681, 679.01, 600
See application file for complete search history.

(56) References Cited

U.S. PATENT DOCUMENTS

2001/0036057 A1* 11/2001 Fukuyoshi .................... 361/681
2003/0103173 A1   6/2003 Satonaka
(Continued)

FOREIGN PATENT DOCUMENTS

| CN | 1280332 A | 1/2001 |
| EP | 1 892 560 A2 | 2/2008 |

(Continued)

OTHER PUBLICATIONS

Japanese Office Action issued in Japanese Patent Application No. 2011-243646 on Feb. 21, 2012.

*Primary Examiner* — Andargie M Aychillhum
(74) *Attorney, Agent, or Firm* — Birch, Stewart, Kolasch & Birch, LLP

(57) ABSTRACT

Provided is a display device in which a panel module can be fixed to a front cabinet without using screws, and when performing maintenance, the panel module can be easily removed from the front cabinet.
The display device including a panel module having a display surface on the front side thereof, a front cabinet surrounding a peripheral edge part of the panel module, and a back cabinet covering a back side of the panel module includes a flexible hook part protruded toward the back cabinet from the inner surface of the front cabinet, and an L-shaped fixing member which has an L shape and includes a latch plate having a hole part in which the flexible hook part is latched and a contact plate which contacts with a back surface of the panel module so as to fix the front cabinet to the panel module.

18 Claims, 22 Drawing Sheets

(56) References Cited

U.S. PATENT DOCUMENTS

2004/0184224 A1 9/2004 Kumagai et al.
2004/0207767 A1* 10/2004 Hu et al. .................. 348/744
2006/0181843 A1 8/2006 Takahashi
2010/0265638 A1* 10/2010 Sakamoto et al. ....... 361/679.01

FOREIGN PATENT DOCUMENTS

| EP | 2 244 476 A1 | 10/2010 |
| JP | 8-314392 | 11/1996 |
| JP | 2001-100650 A | 4/2001 |
| JP | 2001-305985 A | 11/2001 |
| JP | 2003-167235 A | 6/2003 |
| JP | 2006-221576 A | 8/2006 |
| JP | 2007-279537 A | 10/2007 |
| JP | 2007-333911 A | 12/2007 |
| JP | 2009-42537 A | 2/2009 |
| JP | 2009-151112 A | 7/2009 |
| JP | 2009-200543 A | 9/2009 |
| JP | 2010-237548 A | 10/2010 |
| JP | 2010-243719 A | 10/2010 |
| KR | 2009-0074665 A | 7/2009 |
| WO | WO 03/009263 A1 | 1/2003 |
| WO | WO 2007/074847 A1 | 7/2007 |
| WO | WO 2010/113797 A1 | 10/2010 |

* cited by examiner

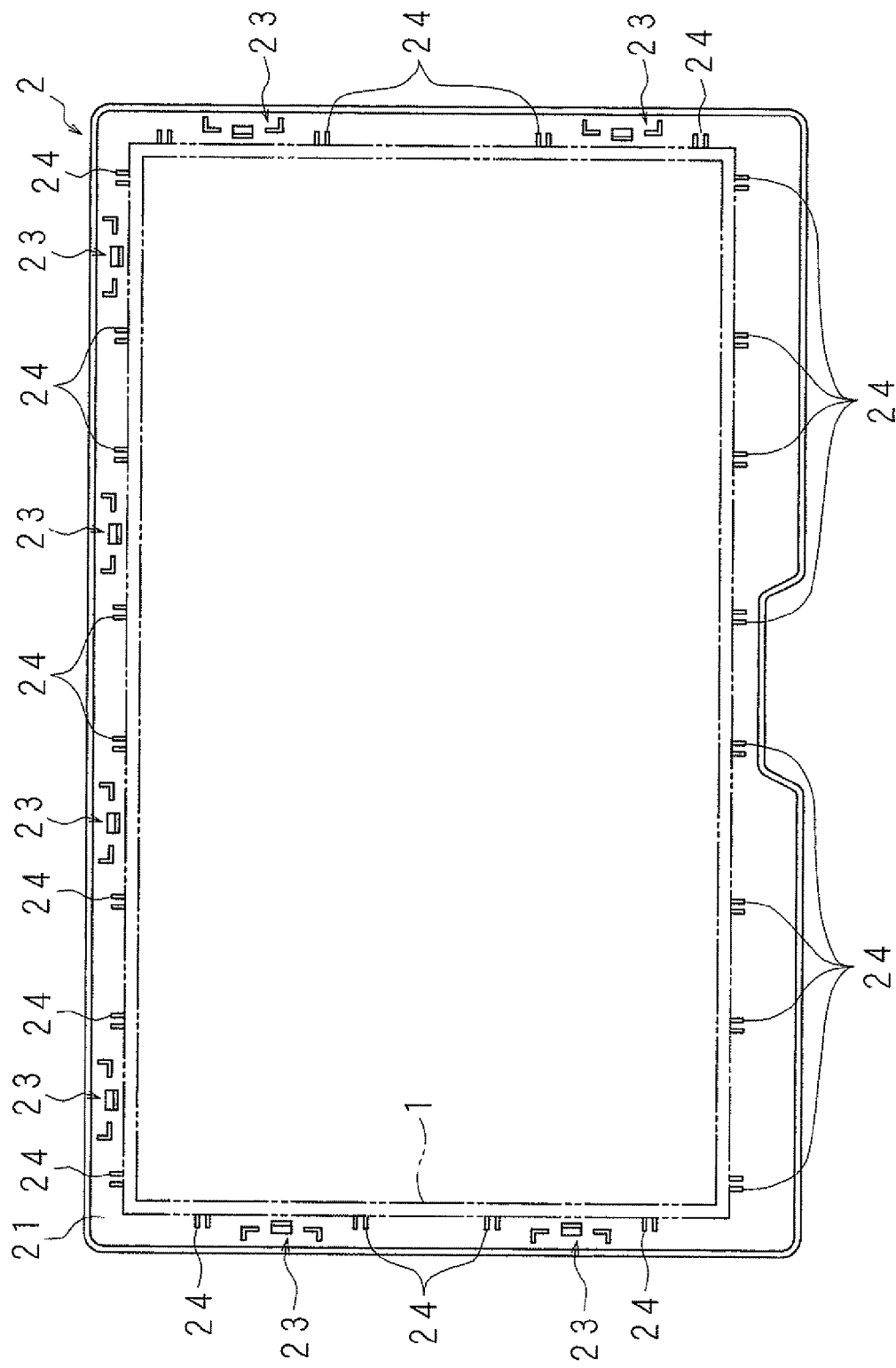

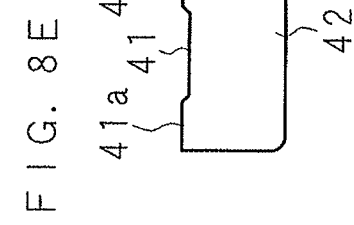
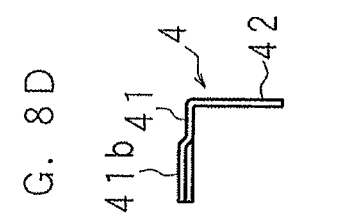
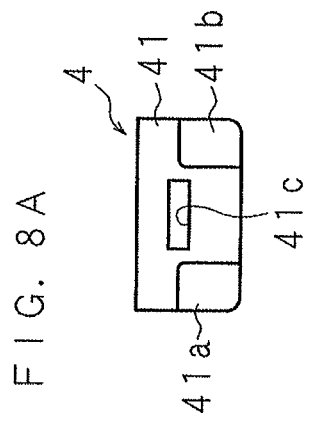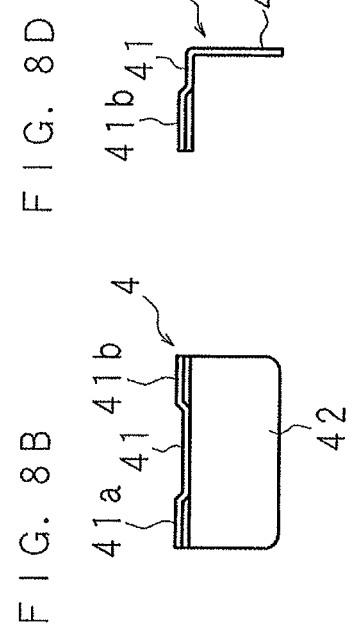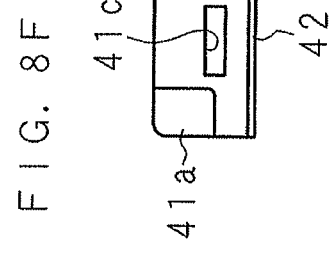
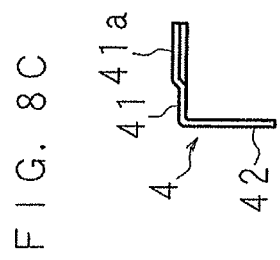

F I G. 10
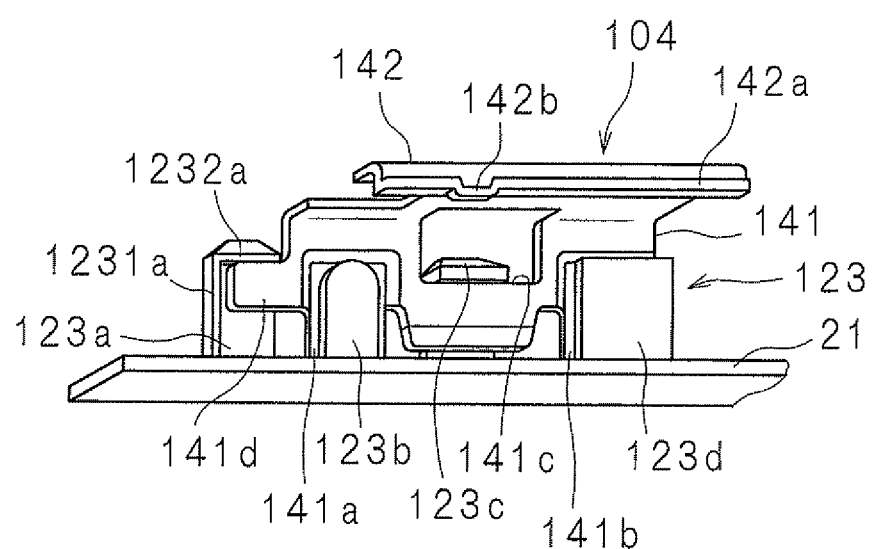

F I G. 1 2
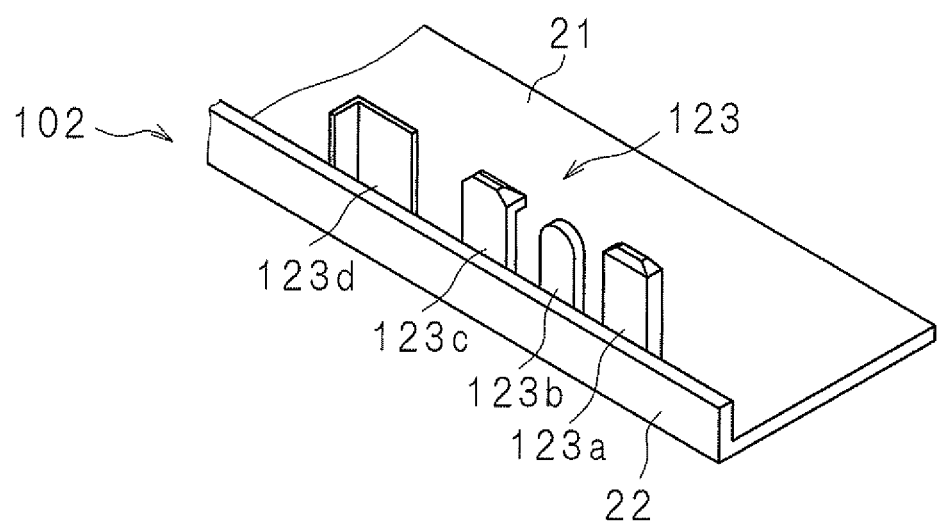

DISPLAY DEVICE AND TELEVISION RECEIVER

This application is the national phase under 35 U.S.C. §371 of PCT International Application No. PCT/JP2011/077494 which has an International filing date of Nov. 29, 2011 and designated the United States of America.

FIELD

The present invention relates to a display device provided with a panel module having a display surface on a front side thereof, a front cabinet surrounding a peripheral edge part of the panel module, and a back cabinet covering a back side of the panel module, and a television receiver.

BACKGROUND

A display device such as a television receiver includes a panel module having a display surface displaying an image on a front side thereof, a front cabinet surrounding a peripheral edge part of the panel module, and a back cabinet covering a back side of the panel module. A conventional display device has a problem that the number of assembly work processes increases because the panel module and the front cabinet are fixed by using screws.

Japanese Patent Application Laid-Open No. 2009-42537 discloses a display device for solving the above-mentioned problem. The display device according to Japanese Patent Application Laid-Open No. 2009-42537 is provided with a plurality of flexible pawl hooks protruded backward from an outer peripheral part of the front cabinet and fixes the front cabinet to the panel module by the pawl hooks.

SUMMARY

However, the display device according to Japanese Patent Application Laid-Open No. 2009-42537 has a problem that it is difficult to remove the front cabinet from the panel module when maintenance is performed. More specifically, when the panel module is removed from the front cabinet, it is necessary to remove a plurality of pawl hooks which are hooked to the edge of the panel module one by one. However, on the way of working, the loosened pawl hooks become rehooked to the panel module in many cases. Therefore, a plurality of workers are required to remove the panel module, or it is necessary to interpose a member such as a wedge between the pawl hook and the panel module so that the pawl hook which was once loosened is not rehooked to the panel module. This problem is especially remarkable when the size of a display device is increased, thereby deteriorating maintainability.

The present invention is made in view of such circumstances. The present invention has an object to provide a display device in which a panel module can be fixed to a front cabinet without using screws, and further, when maintenance is performed, the panel module can be easily removed from the front cabinet, and a television receiver.

A display device according to one aspect of the present invention which includes a panel module having a display surface on a front side thereof, a front cabinet surrounding a peripheral edge part of the panel module and a back cabinet covering a back side of the panel module, includes: a flexible hook part protruded toward the back cabinet from an inner surface of the front cabinet; and an L-shaped fixing member fixing the front cabinet to the panel module, which has an L shape when viewed from a side and includes a latch plate having a hole part in which the flexible hook part is latched and a contact plate which is in contact with a back surface of the panel module.

According to the present invention, it is possible to fix the front cabinet to the panel module by making the contact plate of the L-shaped fixing member to be in contact with the back surface of the panel module and hooking the latch plate of the L-shaped fixing member to the flexible hook part of the front cabinet.

Further, when maintenance is performed, it is possible to easily remove the panel module from the front cabinet by removing the L-shaped fixing member hooked to the flexible hook part. That is, the flexible hook part is not rehooked to the panel module by removing the L-shaped fixing member, whereby it is possible to easily remove the panel module from the front cabinet.

In the display device according to the present invention, the back cabinet includes a restriction part restricting the flexible hook part from bending in a direction of unhooking from the hole part of the latch plate.

According to the present invention, it is possible to restrict that the flexible hook part bends in the direction of removing from the L-shaped fixing member by the restriction part installed in the back cabinet. Therefore, while the display device is used, by an impact, the flexible hook part does not unhook from the L-shaped fixing member and the front cabinet does not fall off the panel module.

In the display device according to the present invention, the front cabinet includes a supporting member supporting the L-shaped fixing member in which the flexible hook part is latched.

According to the present invention, it is possible for the L-shaped fixing member to be guided to the place where the flexible hook part is latched and be supported to the front cabinet.

In the display device according to the present invention, the supporting member has two supporting members installed on both sides of the flexible hook part along the panel module facing the flexible hook part to sandwich the latch plate to which the flexible hook part is latched together with the flexible hook part, and includes a protruded piece protruded from the latch plate along the panel module facing the latch plate and a positioning protrusion which is protruded toward the back cabinet from the inner surface of the front cabinet and is in contact with the protruded piece to position a mounting position of the L-shaped fixing member.

According to the present invention, it is possible to perform the work of positioning the L-shaped fixing member for the flexible hook part and the work of latching the flexible hook part in the hole part of the L-shaped fixing member step by step. Therefore, the mounting workability of the L-shaped fixing member is improved.

In the display device according to the present invention, the positioning protrusion includes a first protruding strip restricting the L-shaped fixing member from moving in a direction along the peripheral edge part of the panel module when the L-shaped fixing member is latched to the flexible hook part and a second protruding strip restricting the L-shaped fixing member from moving toward the back cabinet when the L-shaped fixing member is latched to the flexible hook part.

According to the present invention, in a state where the protruded piece of the L-shaped fixing member is in contact with the positioning protrusion, it is possible to latch the flexible hook part to the L-shaped fixing member by rotating the L-shaped fixing member.

In the display device according to the present invention, the contact plate includes a contact convex part which is in contact with the back surface of the panel module, and the contact convex part and a portion to which the flexible hook part is latched are separated in a direction along the peripheral edge part of the panel module.

According to the present invention, since the contact convex part and the portion to which the flexible hook part is latched are separated in the direction along the peripheral edge part of the panel module, a large force is not applied to the flexible hook part even if the latching amount of the flexible hook part is varied. Therefore, the mounting workability of the L-shaped fixing member is not deteriorated. Further, the front cabinet is not deformed and there is no possibility that the good appearance thereof is spoiled.

In the display device according to the present invention, the display device includes a contact member which is installed laterally and vertically at an inner side from the flexible hook part of the front cabinet and contacts with the outer periphery of the panel module.

According to the present invention, the contact member installed laterally and vertically at an inner side from the flexible hook part of the front cabinet contacts the outer periphery of the panel module. Therefore, when the panel module moves with respect to the front cabinet, it is prevented that the panel module is directly in contact with the flexible hook part to apply an unexpected stress. Therefore, it is possible to prevent the flexible hook part from being bent.

In the display device according to the present invention, the flexible hook parts are installed on both sides and an inside of the upper portion of the front cabinet.

According to the present invention, the flexible hook parts are installed on both sides and the upper portion of the front cabinet. That is, the flexible hook part is not installed on the bottom of the front cabinet. Therefore, the front cabinet can be mounted on the panel module by the minimum number of flexible hook parts, whereby it is possible to fabricate the display device at low cost.

In the display device according to the present invention, the front cabinet includes a frame plate part covering the periphery of the display surface side of the panel module and a front frame part extending backward from the outer peripheral edge of the frame plate part to cover the outer periphery of the panel module, wherein the flexible hook part is protruded from an inner surface of the front frame part and is configured to be bent close to and away from the panel module.

According to the present invention, since the flexible hook part is bent in the direction close to and away from the panel module, even if there is a manufacturing error in the panel module, the latching position of the flexible hook part is varied with respect to the L-shaped fixing member and the flexible hook part is latched to the L-shaped fixing member. Therefore, it is possible to make the L-shaped fixing member come into contact with the panel module at all times regardless of a manufacturing error in the panel module and to suppress the occurrence of chattering due to a sound.

Further, since the latching position of the flexible hook part is varied, even if there is a manufacturing error in the panel module, it is not necessary, for example, to forcibly push the L-shaped fixing member to latch the flexible hook part.

In the display device according to the present invention, the contact plate is curved such that the panel module side thereof is protruded.

According to the present invention, since the contact plate of the L-shaped fixing member is protruded at the panel module side, the contact plate makes linear contact with respect to the panel module. In addition, even if there is a manufacturing error in the panel module and the attitude of the L-shaped fixing member is varied with respect to the panel module, the L-shaped fixing member linearly contacts with the panel module. Therefore, it is possible to make the L-shaped fixing member come into contact with the panel module at all times regardless of a manufacturing error in the panel module and to suppress the occurrence of chattering due to a sound.

In the display device according to the present invention, the flexible hook part has a front end which is positioned backward from the panel module.

According to the present invention, since the front end portion of the flexible hook part is protruded to the backward from the panel module, when the front cabinet is removed from the panel module to perform maintenance, it is easy to confirm the position of the flexible hook part with the naked eye and it is possible to easily remove the flexible hook part by hooking the finger to the front end of the flexible hook part.

In the display device according to the present invention, the panel module includes a liquid crystal panel, a backlight device disposed on the back side of the liquid crystal panel, and a holding frame which integrally holds the liquid crystal panel and the backlight device.

According to the present invention, the panel module is configured by causing the liquid crystal panel and the backlight device to be integrated by means of the holding frame.

A television receiver according to another aspect of the present invention includes the display device according to any one of the above-described display devices and a receiving unit receiving a video signal, wherein the display device is configured to display an image based on the video signal received by the receiving unit.

According to the present invention, it is possible to receive the video signal and display the image related to the video signal on the display device.

According to the present invention, it is possible to fix the panel module to the front cabinet without using screws, and further, when maintenance is performed, it is possible to easily remove the panel module from the front cabinet.

The above and further objects and features will more fully be apparent from the following detailed description with accompanying drawings.

BRIEF DESCRIPTION OF THE DRAWINGS

FIG. 6 is a rear view of the front cabinet.

FIGS. 8A-8F are six principal views of the L-shaped fixing member.

FIG. 10 is an exploded rear perspective view of a main part showing the state that the L-shaped fixing member according to the modified example 1 is latched to a flexible hook part.

FIG. 12 is a perspective view showing a main part of the front cabinet.

MODES FOR CARRYING OUT THE INVENTION

Hereinafter, the present invention will be described in detail with reference to the accompanying drawings showing the embodiments thereof.

Figure 1:
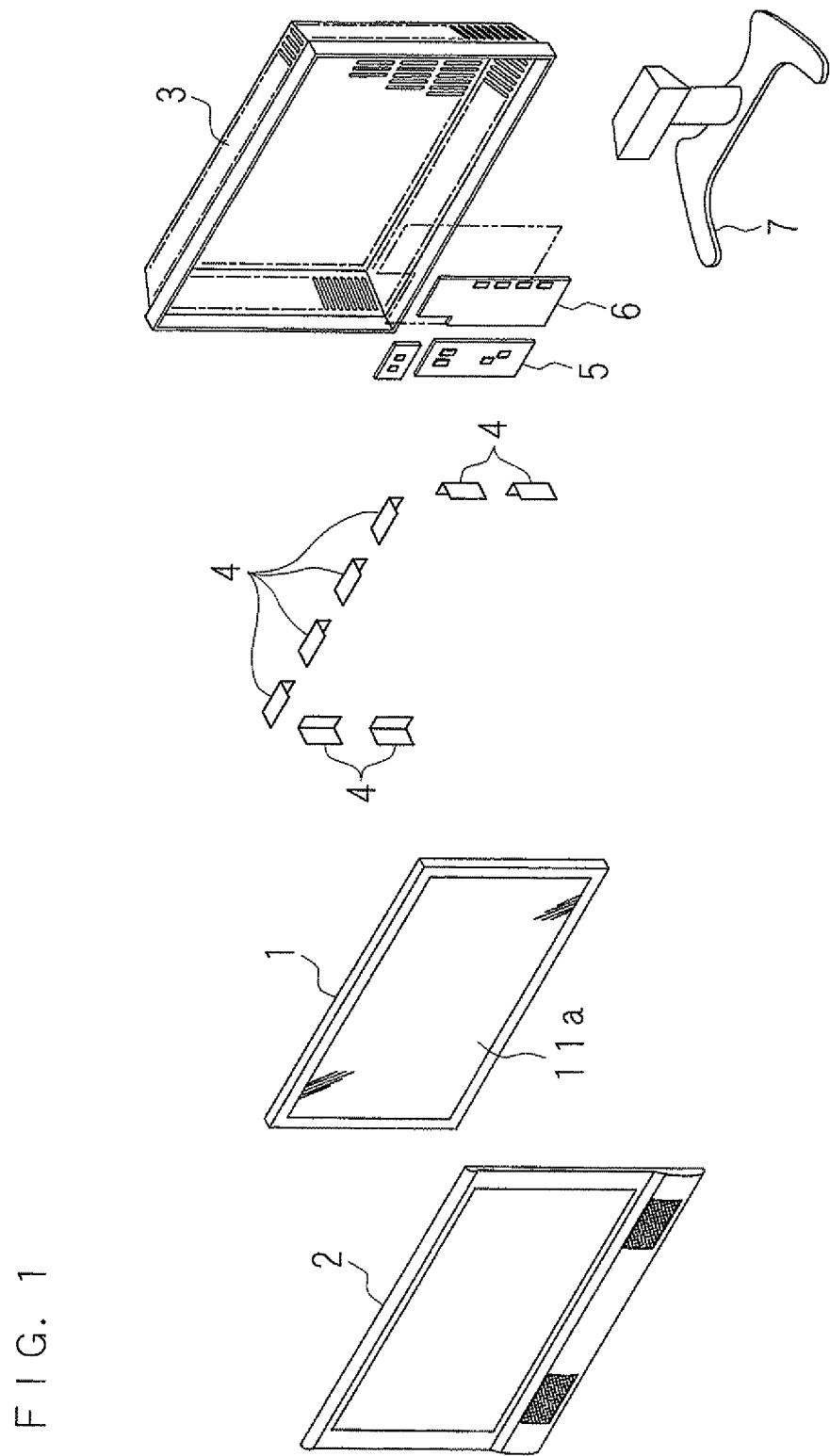
FIG. 1 is an exploded front perspective view showing an example of the configuration of a display device according to an embodiment of the present invention.

FIG. 1 is an exploded front perspective view showing an example of the configuration of a display device according to an embodiment of the present invention. The display device according to the present embodiment is, for example, a television receiver such as a liquid crystal television. The display device includes a panel module 1 which is formed in a substantially rectangular shape and has a display surface 11a on the front side thereof, a front cabinet 2 surrounding a peripheral edge part of the panel module 1, a back cabinet 3 covering a back side of the panel module 1, an L-shaped fixing member 4 made of metal material for fixing the front cabinet 2 to the panel module 1, a tuner 5 (a receiving unit) for receiving video signals, an electric circuit 6, and a stand 7 for supporting the panel module 1 in an upright condition.

Figure 2:
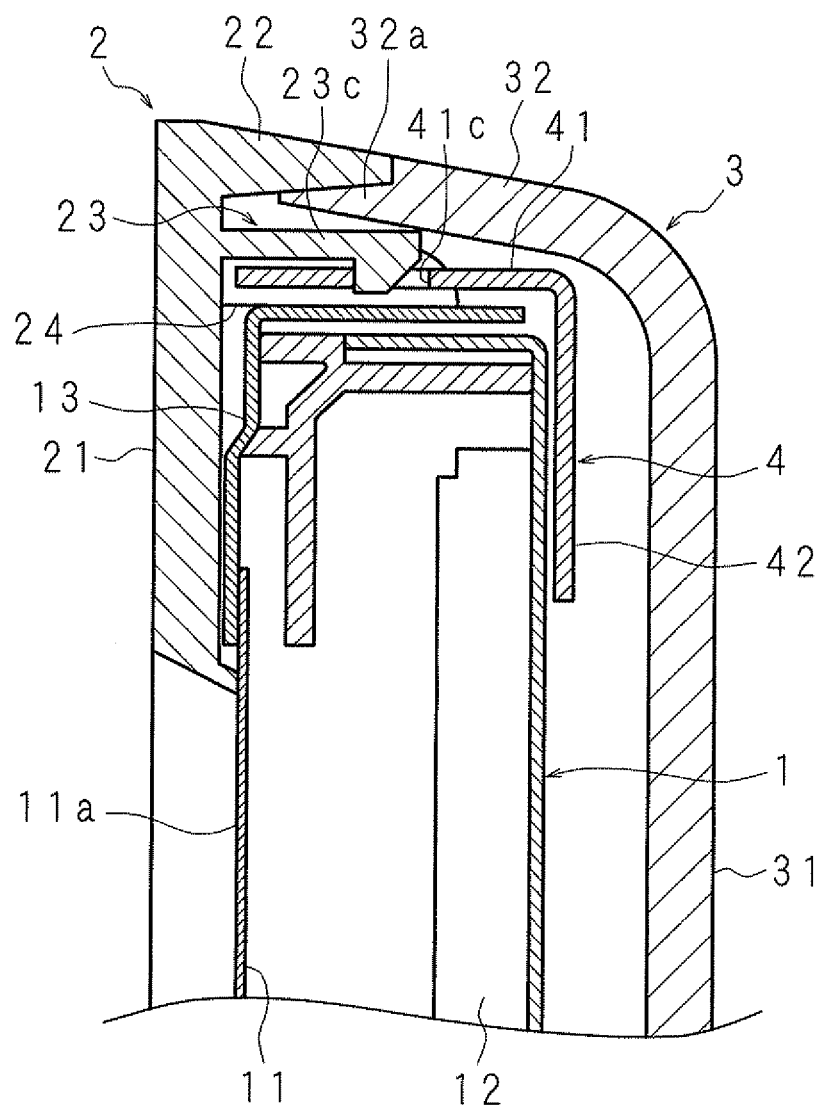
FIG. 2 is an enlarged side cross-sectional view showing a main part of the display device.
Figure 3:
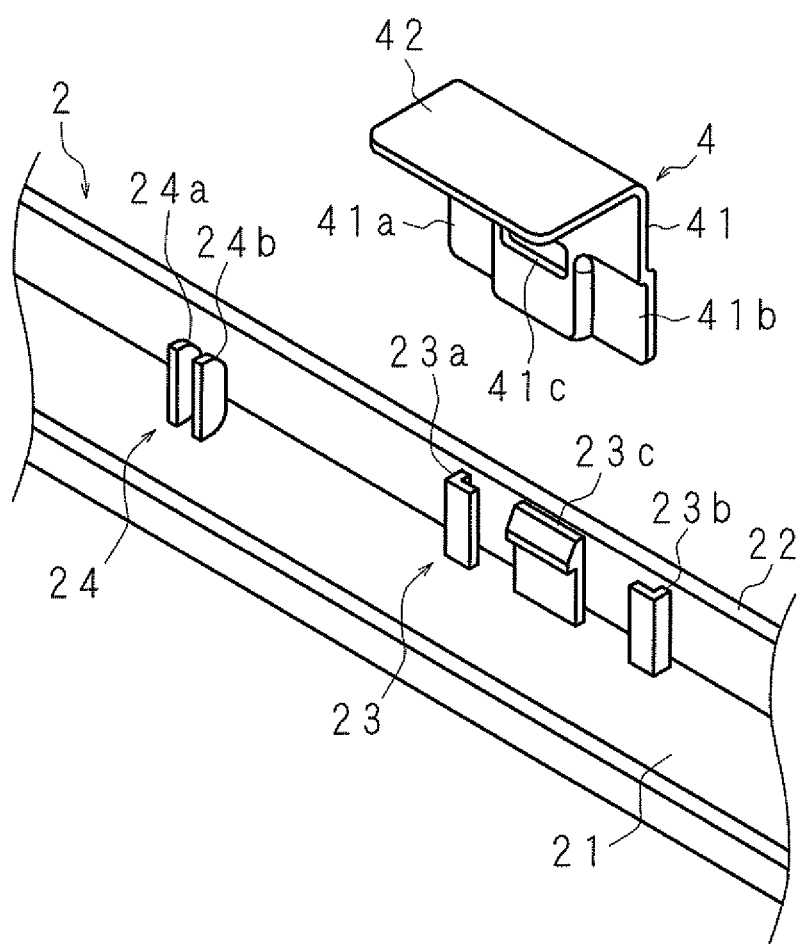
FIG. 3 is an exploded perspective view of a main part showing an L-shaped fixing member removed from a front cabinet.
Figure 4:
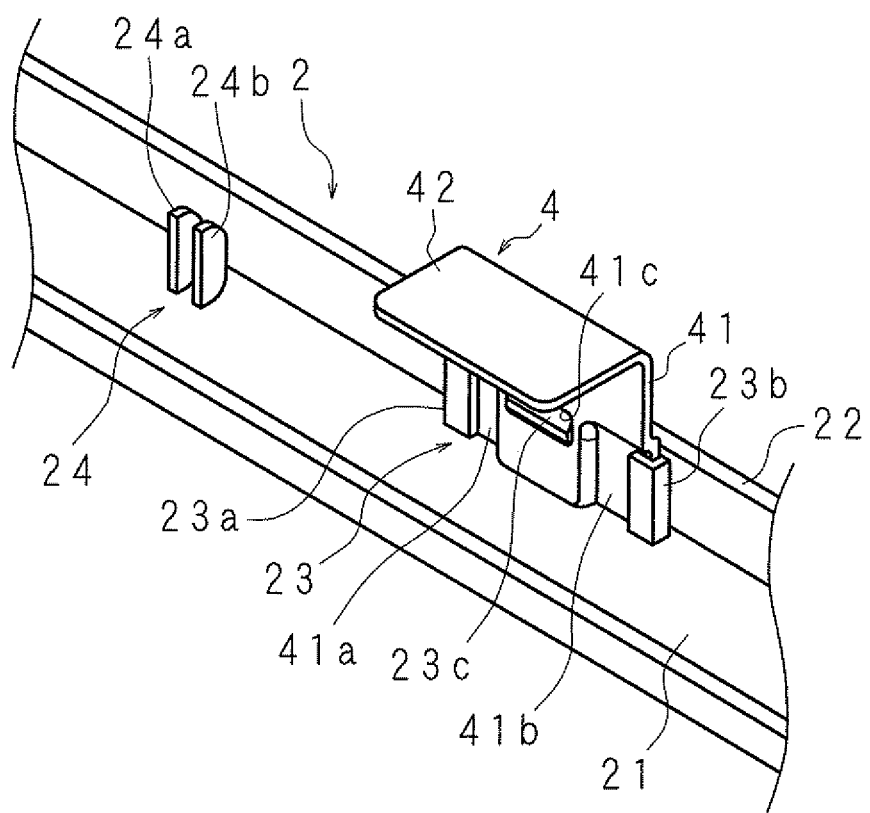
FIG. 4 is an exploded perspective view of a main part showing the L-shaped fixing member mounted on the front cabinet.
Figure 5:
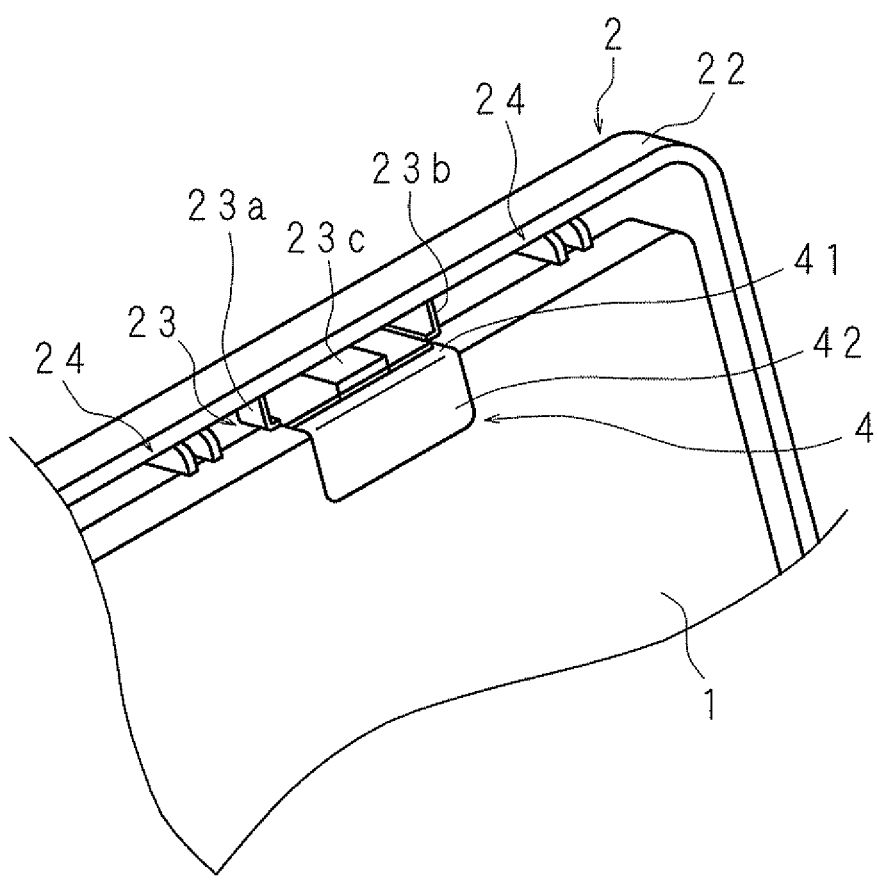
FIG. 5 is an exploded rear perspective view of a main part showing the state that the front cabinet is mounted to the panel module by the L-shaped fixing member.
Figure 7A:
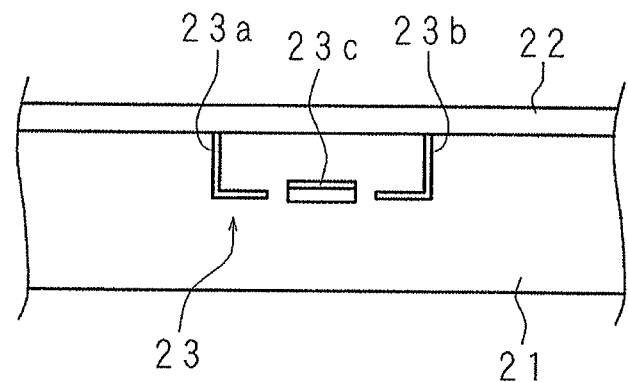
FIGS. 7A and 7B are rear and side views showing a main part of the front cabinet.
Figure 7B:
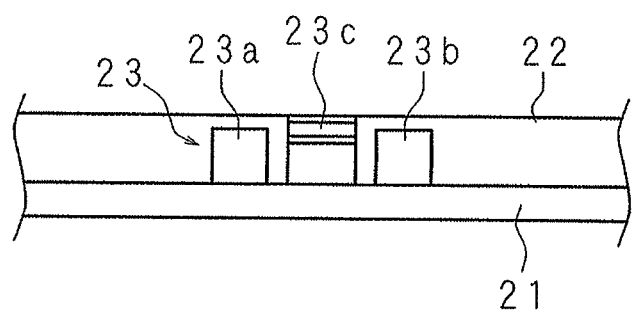

FIG. 2 is an enlarged side cross-sectional view showing a main part of the display device, FIG. 3 is an exploded perspective view of the main part showing the L-shaped fixing member 4 removed from the front cabinet 2, FIG. 4 is an exploded perspective view of the main part showing the L-shaped fixing member 4 mounted on the front cabinet 2, FIG. 5 is an exploded rear perspective view of the main part showing the state that the front cabinet 2 is mounted on the panel module 1 by the L-shaped fixing member 4, FIG. 6 is a rear view of the front cabinet 2, FIGS. 7A and 7B are rear and side views showing the main part of the front cabinet 2, and FIGS. 8A-8F are six principal views of the L-shaped fixing member 4.

The panel module 1 includes a liquid crystal panel 11 which is substantially a rectangular shape and has the display surface 11a on the front side thereof, an optical sheet (not shown) disposed on the back side of the liquid crystal panel 11, a backlight device 12 disposed on the back side of the optical sheet, and a holding frame 13 for integrally holding the liquid crystal panel 11 and the backlight device 12. The backlight device 12 has a flat dish-shaped backlight chassis, a reflective sheet disposed on the backlight chassis, and a plurality of light sources. The light sources may include, for example, an LED or a cold cathode fluorescent tube. Further, the panel module 1 includes screw holes formed on the back side thereof to screw-join the panel module 1 and the back cabinet 3.

The tuner 5 and the electric circuit 6 are mounted on the back side of the backlight chassis included in the backlight device 12.

The front cabinet 2 has a frame plate part 21 covering the periphery of the display surface 11a side of the panel module 1. In addition, the front cabinet 2 has a front frame part 22 extending backward from the outer peripheral edge of the frame plate part 21 and covering the outer periphery of the panel module 1. The frame plate part 21 has a latch means 23 formed on the back surface thereof for latching the L-shaped fixing member 4. As shown in FIG. 6, a plurality of latch means 23 are installed on both sides and the upper portion in the lateral direction of the front cabinet 2, respectively. The number of latch means 23 is suitably determined according to the size of the display device. As shown in FIG. 3, the latch means 23 has a flexible hook part 23c protruded toward the back cabinet 3 from the back surface of the frame plate part 21 and supporting members 23a, 23b for supporting the L-shaped fixing member 4 to which the flexible hook part 23c is latched. The flexible hook part 23c of a plate shape has a hook-shaped portion at the front end thereof and is formed in a linear shape along the periphery of the frame plate part 21, as seen from the back side as shown in FIG. 7A. The hook-shaped portion has a sloping face at the inside of an in-plane direction of the display surface 11a, and the outside of the in-plane direction of the hook-shaped portion is flat. The supporting members 23a, 23b have an L shape imitating both sides of an after-mentioned latch plate 41 of the L-shaped fixing member 4, as seen from the back side. In addition, the supporting members 23a, 23b are formed to guide the L-shaped fixing member 4 to a place where the L-shaped fixing member 4 inserted from the back can be latched to the flexible hook part 23c, as shown in FIGS. 3 and 4. Meanwhile, the heights of the flexible hook part 23c and the supporting members 23a, 23b, that is, the forward and backward dimensions of the display device may be configured to be shorter than the forward and backward dimensions of the front frame part 22. That is, when the front cabinet 2 is seen from the lateral direction, the flexible hook part 23c and the supporting members 23a, 23b may be configured to be covered by the front frame part 22. By this configuration, it is possible to prevent that the flexible hook part 23c and the supporting members 23a, 23b protruded backward from the front cabinet 2 are damaged in the assembly process of the display device.

Further, the front cabinet 2 is protruded toward the back cabinet 3 from the back surface of the frame plate part 21 so as to be positioned at inside in the lateral and vertical directions from the flexible hook part 23c. In addition, the front cabinet 2 is provided with a plurality of contact pieces (contact members) 24a, 24b which are in contact with the outer peripheral surface of the panel module 1. Since the front cabinet 2 is provided with the contact pieces 24a and 24b, it is possible to prevent that the panel module 1 comes into direct contact with the flexible hook part 23c, so that unexpected stress is applied to break the flexible hook part 23c. Further, by means of the contact pieces 24a, 24b, it is possible to decide the position of the front cabinet 2 with respect to the panel module 1 at a predetermined place.

The L-shaped fixing member 4 has an L shape as shown in FIGS. 8A-8F and includes a latch plate 41 having a hole part 41c in which the flexible hook part 23c is latched and a contact plate 42 which is in contact with the back surface of the panel module 1. Meanwhile, FIGS. 8A-8F are six principal views of the L-shaped fixing member 4 installed on the upper portion of the display device which are depicted with respect to the vertical and horizontal directions of the display device. FIGS. 8A-8F are a plan view, a front view, a left side view, a right side view, a rear view and a bottom view of the L-shaped fixing member 4, respectively. The latch plate 41 and the contact plate 42 are substantially a rectangular shape, respectively, and the long edges thereof are connected to each other. The slip-shaped hole part 41c is formed at a substantially central portion of the latch plate 41 in a lengthwise direction of the latch plate 41. The latch plate 41 has concave parts 41a, 41b configured to be supported by the supporting members 23a, 23b at both sides of the front end portion in the lengthwise direction thereof.

Further, the contact plate 42 of the L-shaped fixing member 4 is a flat plate shape, but may have a hole part or concave part formed to fit the convex part formed in the panel module 1. By this configuration, it is possible to prevent that the contact plate 42 of the L-shaped fixing member 4 is displaced with respect to the panel module 1 and the front cabinet 2 can be fixed to the panel module 1 more securely.

The back cabinet 3 includes a dish-shaped cover part 31 covering the back side of the panel module 1 and a rear frame part 32 extending to the periphery of the dish-shaped cover part 31. The rear frame part 32 has a restriction claw portion 32a for restricting that the flexible hook part 23c bends in a direction of unhooking from the hole part 41c of the latch plate 41, at a plurality of circumferential positions corresponding to the flexible hook part 23c. That is, the restriction claw portion 32a is formed at a place so as to be inserted between the flexible hook part 23c and the front frame part 22 of the front cabinet 2 when the front cabinet 2 and the back cabinet 3 are assembled, and the restriction claw portion 32a has a thickness equal to a gap between the outer flat surface of the flexible hook part 23c and the inner wall of the front frame part 22. Further, the back cabinet 3 has a plurality of screw holes in which screws are inserted for screw-joining to the panel module 1.

In the display device configured like this, the front cabinet 2 can be fixed to the panel module 1 by making the contact plate 42 of the L-shaped fixing member 4 contact the back side of the panel module 1 and hooking the latch plate 41 of the L-shaped fixing member 4 to the flexible hook part 23c of the front cabinet 2. Further, when maintenance is performed, the L-shaped fixing member 4 hooked to the flexible hook part 23c is removed, so that the flexible hook part 23c that the L-shaped fixing member 4 has been removed is not rehooked to the panel module 1. Therefore, it is possible to easily remove the panel module 1 from the front cabinet 2.

Thus, the panel module 1 can be fixed to the front cabinet 2 without using screws, and when maintenance is performed, the panel module 1 can be easily removed from the front cabinet 2.

Further, it is possible to obtain the above-described effects without making a special structure in the panel module 1 by configuration for fixing the front cabinet 2 to the panel module 1 through the L-shaped fixing member.

In addition, when the front cabinet 2 and the back cabinet 3 are assembled, it is possible to prevent the flexible hook part 23c from bending outward because the restriction claw portion 32a is inserted between the flexible hook part 23c and the front cabinet 2. Therefore, it is possible to prevent the front cabinet 2 from falling away by impact, etc. while the display is used.

Further, since the front cabinet 2 is configured to be fixed to the panel module 1 without using screws, it is not necessary to form a boss for screw joining in the frame plate part 21 of the front cabinet 2, so that the front cabinet 2 can be narrowed.

Further, by providing with contact pieces 24a, 24b, it is possible to prevent the panel module 1 from coming into direct contact with the flexible hook part 23c to apply an unexpected stress, and the breaking of the flexible hook part 23c can be prevented.

Further, the flexible hook parts 23c are installed on both sides and an upper portion of the front cabinet 2, while the flexible hook parts 23c is not installed on the bottom thereof. Therefore, the front cabinet 2 can be mounted on the panel module 1 by the minimum number of the flexible hook part 23c, whereby it is possible to fabricate the display device at low cost.

In the present embodiment, the liquid crystal television is described as an example of the display device, but of course, the present invention may be applied to a display device such as a plasma display device or an EL display. Further, the present invention may be applied to a display device without the tuner 5, for example, a display for a personal computer.

MODIFIED EXAMPLE 1

Figure 9:
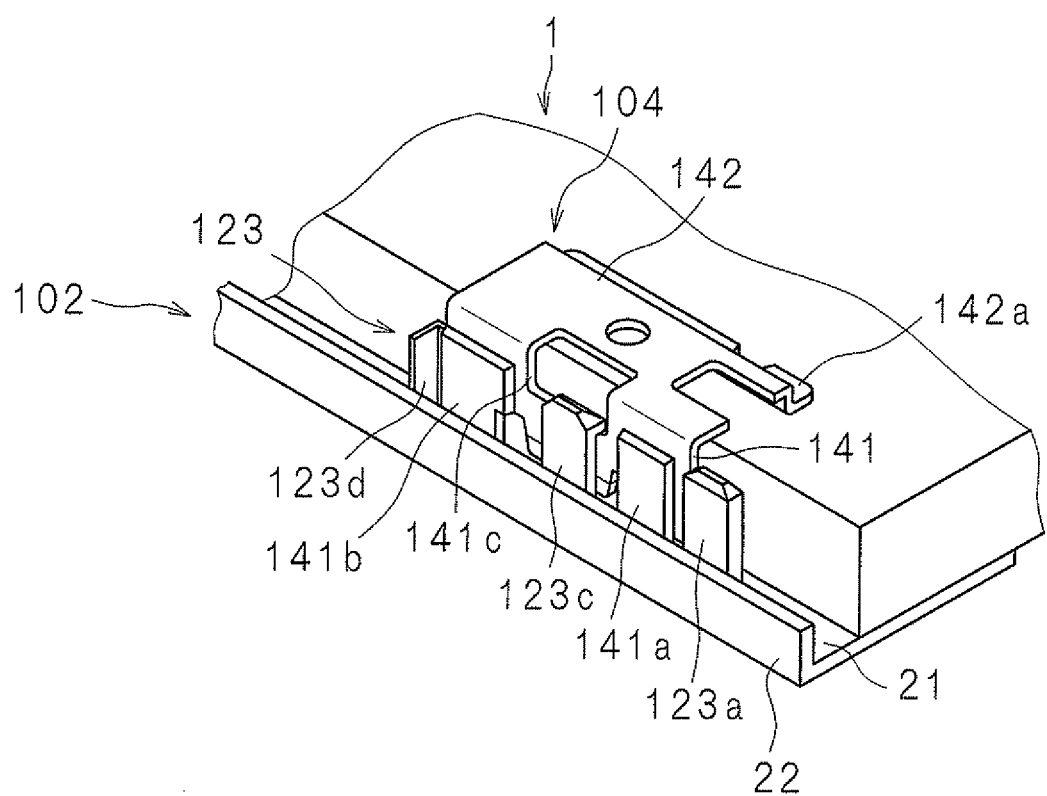
FIG. 9 is an exploded rear perspective view of a main part showing the state that the front cabinet is mounted to the panel module by an L-shaped fixing member according to a modified example 1.
Figure 11:
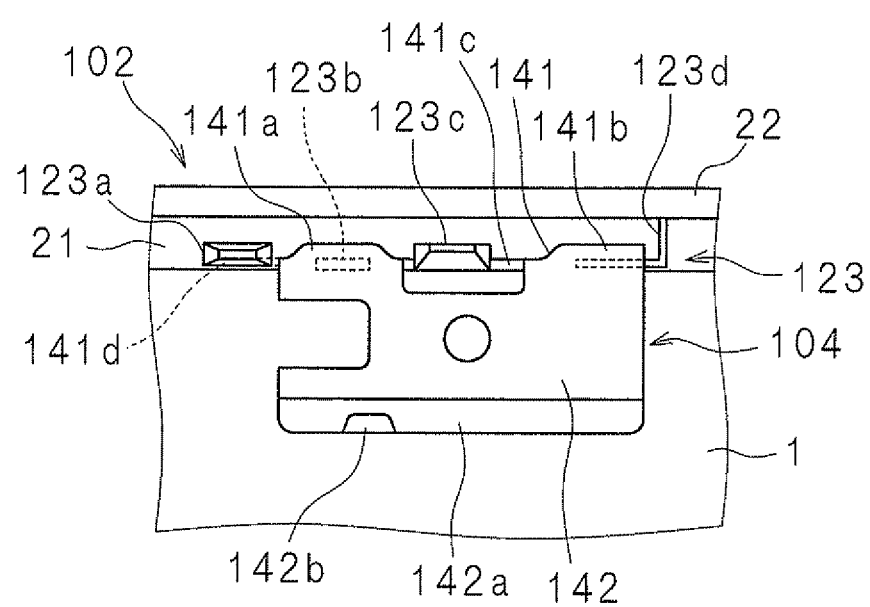
FIG. 11 is an exploded rear view of a main part showing the state that the front cabinet is mounted to the panel module by the L-shaped fixing member according to the modified example 1.

FIG. 9 is an exploded rear perspective view of a main part showing the state that a front cabinet 102 is mounted on the panel module 1 by an L-shaped fixing member 104 according to a modified example 1, FIG. 10 is an exploded rear perspective view of the main part showing the state that the L-shaped fixing member 104 according to the modified example 1 is latched to a flexible hook part 123C, and FIG. 11 is an exploded rear view of the main part showing the state that the front cabinet 102 is mounted to the panel module 1 by the L-shaped fixing member 104 according to the modified example 1. FIG. 12 is a perspective view showing the main part of the front cabinet 102, FIGS. 13A and 13B are rear and side views showing the main part of the front cabinet 102, FIG. 14 is a perspective view of the L-shaped fixing member 104, and FIGS. 15A-15F are six principal views of the L-shaped fixing member 104.

Similar to the embodiment, a plurality of latch means 123 according to the modified example 1 are installed on both sides and the upper portion in the lateral direction of the front cabinet 102, respectively, which are installed on the back surface of the frame plate part 21. The latch means 123 has, as shown in FIGS. 12 and 13A-13B, a flexible hook part 123c protruded toward the back cabinet 3 from the back surface of the frame plate part 21, a first supporting member 123b and a second supporting member 123d supporting the L-shaped fixing member 104 in which the flexible hook part 123c is latched, and a positioning protrusion 123a. The first and second supporting members 123b and 123d are disposed on both sides of the flexible hook part 123c along the panel module 1 facing the flexible hook part 123c. Further, the positioning protrusion 123a, the supporting members 123b, the flexible hook part 123c, and the second supporting members 123d are installed along the panel module 1 facing the flexible hook part 123c, in sequence from the positioning protrusion 123a.

Figure 13A:
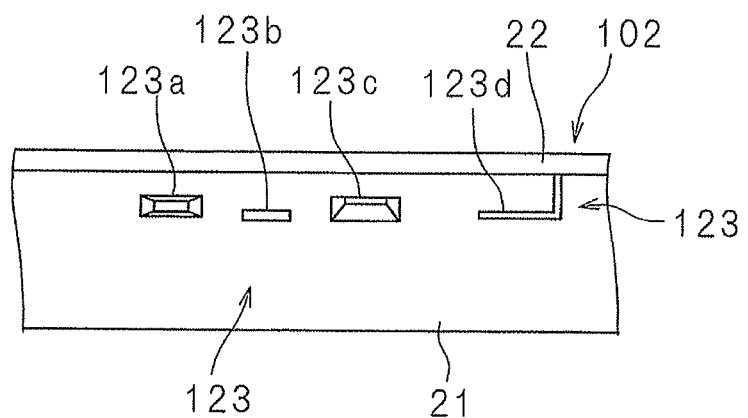
FIGS. 13A and 13B are rear and side views showing the main part of the front cabinet.
Figure 13B:
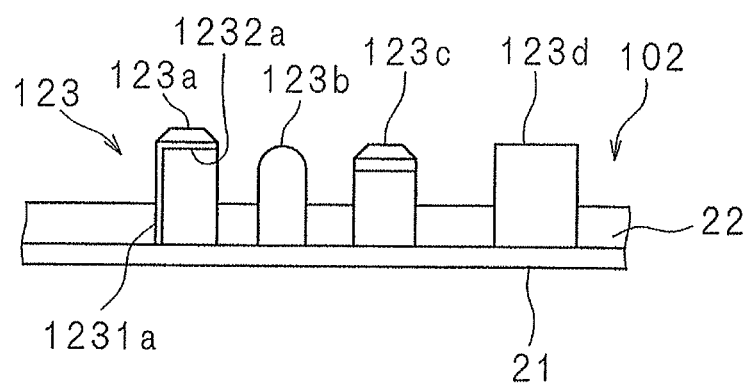
Figure 14:
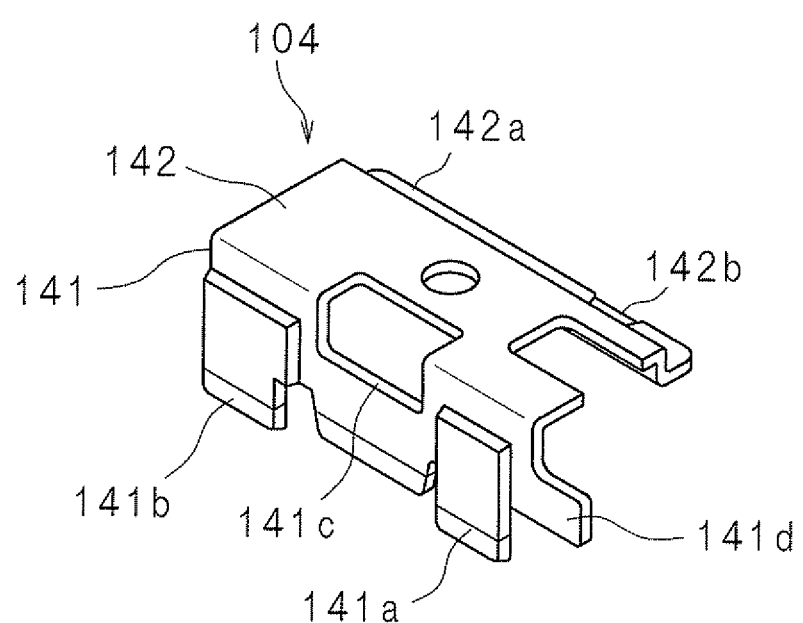
FIG. 14 is a perspective view of the L-shaped fixing member.
Figure 15:
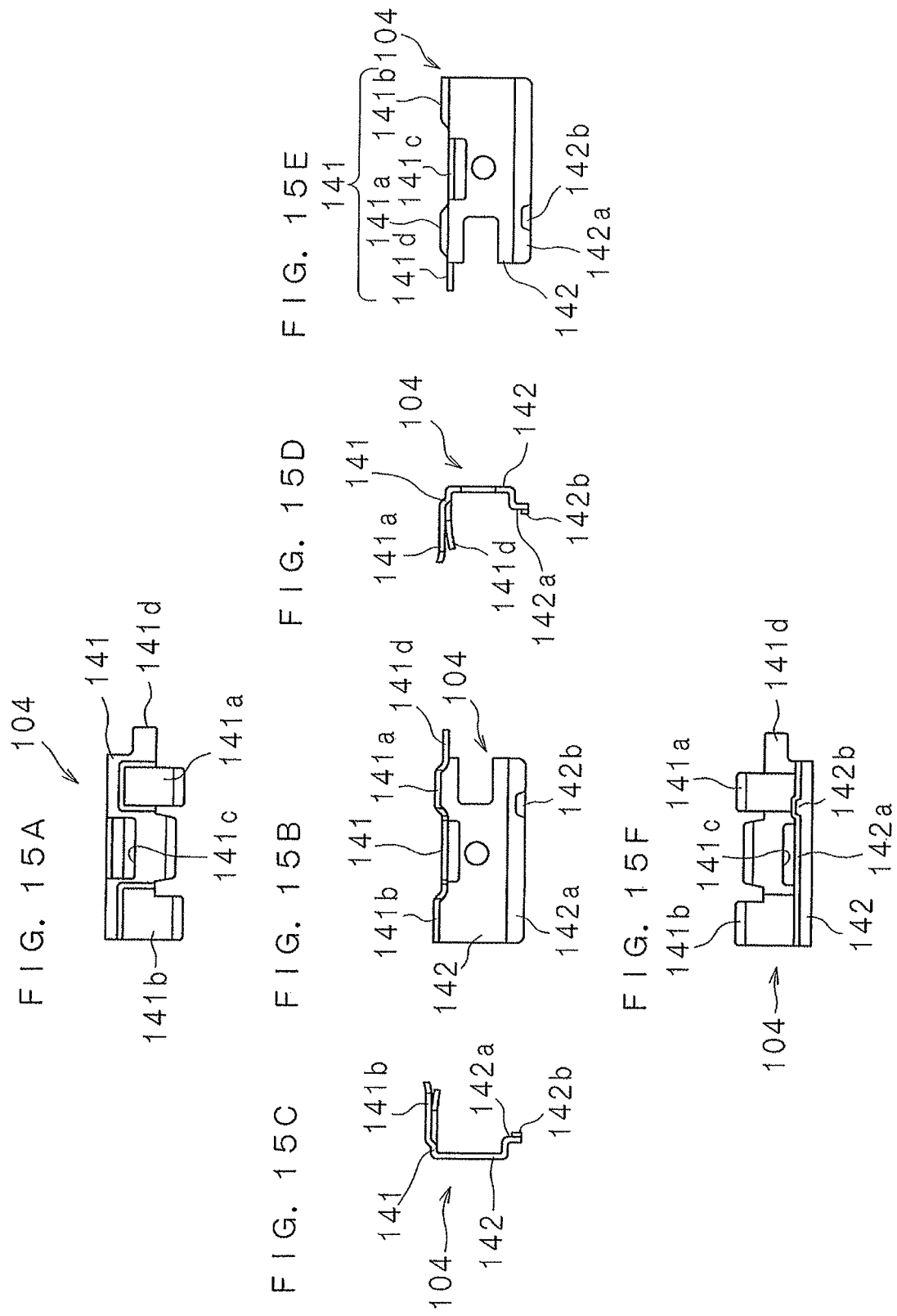
FIGS. 15A-15F are six principal views of the L-shaped fixing member.

The flexible hook part 123c of a plate shape has a hook-shaped portion at the front end thereof and is formed in a linear shape along the periphery of the frame plate part 21, as seen from the back side as shown in FIG. 13A. The hook-shaped portion has a sloping face inside of the in-plane direction of the display surface 11a, and the outside of the in-plane direction of the hook-shaped portion is flat.

The first supporting member 123b is formed in a substantially rectangular plate shape with the front end curved and is formed in a linear shape along the periphery of the frame plate part 21, as seen from the back side as shown in FIG. 13A. As shown in FIGS. 9 and 10, the first supporting member 123b is configured so as to sandwich the L-shaped fixing member 104 in which the flexible hook part 123c is latched, together with the flexible hook part 123c. More specifically, the first supporting member 123b is positioned at the panel module 1 side from the flexible hook part 123c so as to restrict that the L-shaped fixing member 104 moves toward the panel module 1 from the flexible hook part 123c to fall away from the hole part 141c.

The second supporting member 123d has an L shape imitating the side of the latch plate 141, as seen from the back side, and the second supporting member 123d is provided with a first plate piece substantially parallel with the face of the facing panel module 1 and a substantially vertical second plate piece. As shown in FIGS. 9 and 10, the second supporting member 123d latches the L-shaped fixing member 104 so as to sandwich the L-shaped fixing member 104 in which the flexible hook part 123c is latched, together with the flexible hook part 123c. More specifically, the first plate piece included in the second supporting member 123d is positioned at the panel module 1 side from the flexible hook part 123c, so that the L-shaped fixing member 104 together with the first supporting member 123b moves toward the panel module 1 from the flexible hook part 123c to restrict the falling away from the hole part 141c. In addition, the second plate piece included in the second supporting member 123d latches the L-shaped fixing member 104 so as to sandwich the L-shaped fixing member 104 from both sides, together with the positioning protrusion 123a to be described below.

A positioning member is a member for positioning the mounting position of the L-shaped fixing member 104 in contact with the protruded piece 141d protruded from a latch plate 141 as described below. As shown in FIG. 13A, the positioning member is formed in a linear shape along the periphery of the frame plate part 21, as seen from the back side. Generally, the positioning member is formed in a substantially rectangular plate shape. The positioning member has a first protruding strip 1231a which restricts that the L-shaped fixing member 104 moves in the direction along the peripheral edge part of the panel module 1 when the L-shaped fixing member 104 is latched to the flexible hook part 123c and a second protruding strip 1232a which restricts that the L-shaped fixing member 104 moves toward the back cabinet when the L-shaped fixing member 104 is latched to the flexible hook part 123c. That is, as shown in FIG. 13B, the first protruding strip 1231a and the second protruding strip 1232a are formed of plate material so as to have an inverted L shape.

The L-shaped fixing member 104 has an L shape as shown in FIGS. 14 and 15A-15F. The L-shaped fixing member 104 includes the latch plate 141 having a hole part 141c in which the flexible hook part 123c is latched and a contact plate 142 which is in contact with the back surface of the panel module 1. The latch plate 141 and the contact plate 142 are substantially a rectangular shape, respectively, and have the long edges thereof connected to each other. Meanwhile, FIGS. 15A-15F are six principal views of the L-shaped fixing member 104 installed on the upper portion of the display device, and they are depicted with respect to the vertical and horizontal directions of the display device. FIGS. 15A-15F are a plan view, a front view, a left side view, a right side view, a rear view and a bottom view of the L-shaped fixing member 104, respectively.

The latch plate 141 has a hole part 141c in which the flexible hook part 123c is latched. The hole part 141c is formed in a substantially central portion of the latch plate 141 in the lengthwise direction of the latch plate 141. Further, the latch plate 141 has first and second concave parts 141a and 141b into which the first and second supporting members 123b and 123d are inserted and supported at both sides of the hole part 141c, that is, both sides in the lengthwise direction of the latch plate 141. The first and second concave parts 141a and 141b are formed such that they are concave as seen from the side where the contact plate 142 is installed and are convex as seen from the side where the contact plate 142 is not installed (in front in FIG. 14). Further, the first and second concave parts 141a and 141b have a front end portion, that is, a tongue piece portion protruded toward the front cabinet 102. The front end portion of the tongue piece portion is bent toward the front frame part 22 of the front cabinet 102 in order to easily insert the first and second supporting members 123b and 123d into the first and second concave parts 141a and 141b of the L-shaped fixing member 104. Similarly, the L-shaped fixing member 104 has a tongue portion protruded from the periphery of the hole part 141c toward the front cabinet 102. The front end portion of the tongue portion is also bent toward the panel module 1 in order to easily insert and latch the flexible hook part 123c in the hole part 141c of the L-shaped fixing member 104.

The latch plate 141 has a protruded piece 141d protruded toward the positioning protrusion 123a from the latch plate 141 along the periphery of the panel module 1 facing the latch plate 141.

The contact plate 142 has a stepped portion 142a at the long edge portion of the side not connected to the latch plate 141. The stepped portion 142a is curved so as to go near toward the frame plate part 21, and the stepped portion 142a has a contact convex part 142b formed so as to contact the back side of the panel module 1. The contact convex part 142b is protruded toward the panel module 1. The contact convex part 142b is separated in the direction along the periphery of the panel module 1 from the part in which the flexible hook part 123c is latched. In the present modified example 1, the contact convex part 142b is separated toward the protruded piece 141d from the part in which the flexible hook part 123c is latched.

Next, a mounting method of the L-shaped fixing member 104 configured like this will be described.

Figure 16:
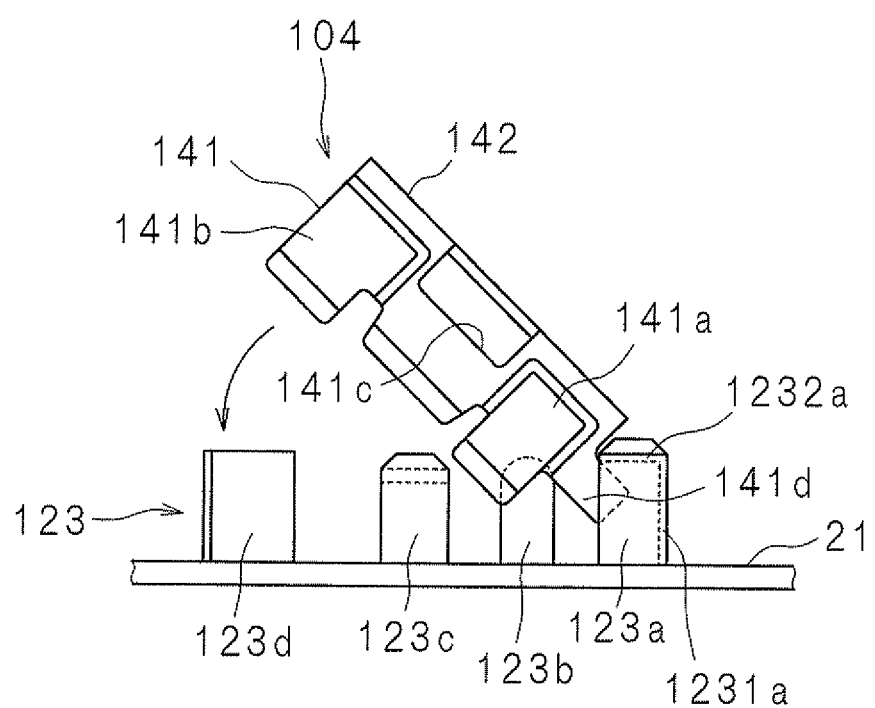
FIG. 16 is a schematic view showing a mounting method of the L-shaped fixing member.

FIG. 16 is a schematic view showing the mounting method of the L-shaped fixing member 104. First, the protruded piece 141d of the L-shaped fixing member 104 is contacted to the front end portion of the positioning protrusion 123a to position the L-shaped fixing member 104. And, while adjusting the attitude of the L-shaped fixing member 104 so that the flexible hook part 123c becomes position-related to fit in the hole part 141c, the L-shaped fixing member 104 is rotated about the positioning protrusion 123a. Thereby, the L-shaped fixing member 104 is inserted into the latch means 123, and the flexible hook part 123c is latched in the hole part 141c.

The display device according to the modified example 1 configured like this is easy to have the L-shaped fixing member 104 mounted thereon as compared with the display device according to the embodiment, whereby it is possible to improve the assembly workability for fixing the front cabinet 102 to the panel module 1. Hereinafter, the effects will be described specifically.

In the display device according to the embodiment, when the L-shaped fixing member 4 is mounted on the latch means 23, because of its configuration, it is necessary to simultaneously carry out the work of positioning the L-shaped fixing member 4 and the work of hanging the flexible hook part 23c on the L-shaped fixing member 4. Therefore, as compared with the display device according to the modified example 1, there is a tendency of being difficult to mount the L-shaped fixing member 4. That is, once the concave parts 41a, 41b of the L-shaped fixing member 4 are inserted into the supporting members 23a, 23b, a positional relationship between the hole part 41c of the L-shaped fixing member 4 and the flexible hook part 23c becomes fixed in this step. When there is a displacement in the mounting position in this step, the front end portion of the flexible hook part 23c bumps into the latch plate 41 even if the L-shaped fixing member 4 is inserted into the latch means 23. Because of this, it becomes necessary to adjust the mounting position of the L-shaped fixing member 4 by bending the flexible hook part 23c with the finger or tilting the L-shaped fixing member 4.

However, in the display device according to the modified example 1, it is possible to position the L-shaped fixing member 104 in a manner that the positional relation between the flexible hook part 123c and the hole part 141c is not completely fixed and carry out the work of latching the flexible hook part 123c to the L-shaped fixing member 104 in sequence. Therefore, it is possible to shorten the mounting work time of the L-shaped fixing member 104 on the whole and improve workability. More specifically, the work of positioning the L-shaped fixing member 104 is carried out by making the protruded piece 141d contact the positioning protrusion 123a. Subsequently, while adjusting the attitude of the L-shaped fixing member 104 so that the flexible hook part 123c can fit in the hole part 141c, the L-shaped fixing member 104 is rotated about the positioning protrusion 123a. Therefore, it is possible to insert the L-shaped fixing member 104 into the latch means 123 and latch the flexible hook part 123c, so that the L-shaped fixing member 104 can be mounted smoothly.

In the display device according to the embodiment, in a case where the latching strength of the flexible hook part 23c is increased for the purpose of reinforcing the fixation of the front cabinet 2 and the panel module 1, when the L-shaped fixing member 4 is mounted, the force of resistance also increases if the flexible hook part 23c is hooked. Therefore, as compared with the display device according to the modified example 1, there is a tendency of workability being deteriorated.

However, in the display device according to the modified example 1, the portion to which the flexible hook part 123c is latched and the contact convex part 142b are separated along the panel module 1. Because of this, as described below, the effort point of the flexible hook part 123c and the working point of the contact convex part 142b become separated. Therefore, when the L-shaped fixing member 104 is mounted, the force of resistance is almost unchanged even if the hooking strength of the flexible hook part 123c is increased. Consequently, good workability can be maintained.

Figure 17A:
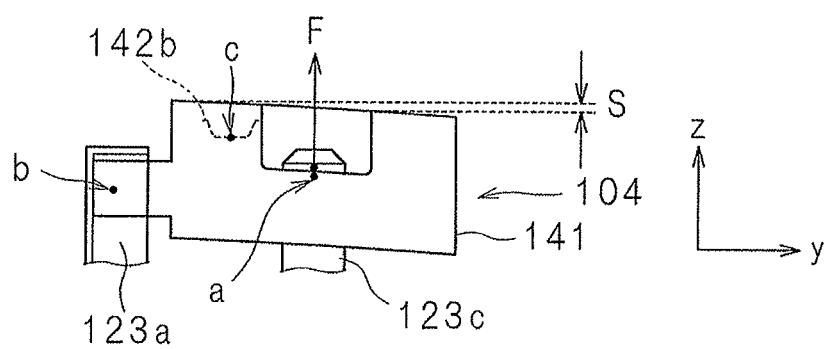
FIGS. 17A and 17B are a conceptual diagram showing the operation of the L-shaped fixing member according to the modified example 1.
Figure 17B:
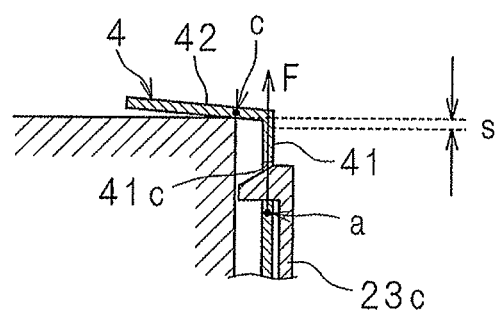

FIGS. 17A and 17B are a conceptual diagram showing the operation of the L-shaped fixing member 104 according to the modified example 1. FIG. 17A is a conceptual diagram showing an effort point a, a support point b, a working point c of the force applied when the L-shaped fixing member 104 according to the modified example 1 is latched to the flexible hook part 123c, and a force F applied to the flexible hook part 123c.

When the L-shaped fixing member 104 is mounted, the portion where the protruded piece 141d comes into contact with the positioning protrusion 123a becomes the support point b, and if the L-shaped fixing member 104 is rotated to move the hole part 141c to the front cabinet 102 side (downward in FIGS. 17A and 17B) from the flexible hook part 123c, then the L-shaped fixing member 104 itself works like a plate spring. Therefore, when the latch plate 141 returns to the original state after it is bent, the flexible hook part 123c is latched in the portion of the effort point a of the hole part 141c. In this case, as shown in FIG. 17A, the portion where the protruded piece 141d comes into contact with the positioning protrusion 123a becomes the support point b, the portion to which the flexible hook part 123c is latched becomes the effort point a, and the contact convex part 142b that comes into contact with the panel module 1 becomes the working point c. If the force applied to the flexible hook part 123c is F and the spring coefficient of the latch plate 141 is k1, the force is represented by F=k1×s. Here, s is the bending amount of the latch plate 141. Because the effort point a and the working point c are separated, the value of k1 is relatively low. Therefore, even if the latching strength of the flexible hook part 123c is increased or the latching strength is varied due to the production deviance, a large force does not act on the flexible hook part 123c. Because of this, the mounting workability of the L-shaped fixing member 104 is not deteriorated. Further, there is no possibility that the aesthetic appearance becomes damaged due to the front cabinet 102 caving in as a large force is applied to the flexible hook part 123c.

For comparison, the means of action of the force by the L-shaped fixing member according to the display device of the embodiment will be described. FIG. 17B is a conceptual diagram showing the effort point a, the working point c of the force applied by latching the L-shaped fixing member 4 to the flexible hook part 23c according to the embodiment, and the force F applied to the flexible hook part 23c. If the force applied to the flexible hook part 23c is F and the spring coefficient of the latch plate 41 is k2, the force is represented by F=k2×s. Here, s is the bending amount of the latch plate 41. As shown in FIG. 17B, in the embodiment, since the effort point a where the flexible hook part 23c is hooked and the working point c where the L-shaped fixing member 4 comes into contact with the panel module 1 are close to each other, the value of k2 is relatively high. If the latching strength of the flexible hook part 23c is changed, an unexpectedly large force may be applied to the flexible hook part 23c. Therefore, there is a possibility that the mounting workability of the L-shaped fixing member 4 is deteriorated or the aesthetic appearance of the front cabinet 2 is damaged.

Thus, as compared with the embodiment 1, the display device according to the modified example 1 can ensure that the mounting workability of the L-shaped fixing member 104 and the aesthetic appearance of the front cabinet 102 are not impaired.

MODIFIED EXAMPLE 2

A display device according to the modified example 2 is different from the embodiment and modified example 1 only in the configuration of the flexible hook part, so that only the differences will be described below. The flexible hook part is to prevent the L-shaped fixing member from falling away, and after the panel module is mounted to the front cabinet by the L-shaped fixing member, the flexible hook part minimally applies force to the L-shaped fixing member. Because of this, rattles occur between the L-shaped fixing member and the panel module in the forward and backward directions of the display device, and chattering due to the sound occurs. As a measure against chattering, a method of adhering a non-woven cloth Himelon to a contact portion of the L-shaped fixing member and the panel module can be considered, but there are problems that workability decreases and the number of parts increases. The display device according to the modified example 2 can prevent chattering due to the sound with avoiding the decrease of workability and the increase of the number of parts.

Figure 18:
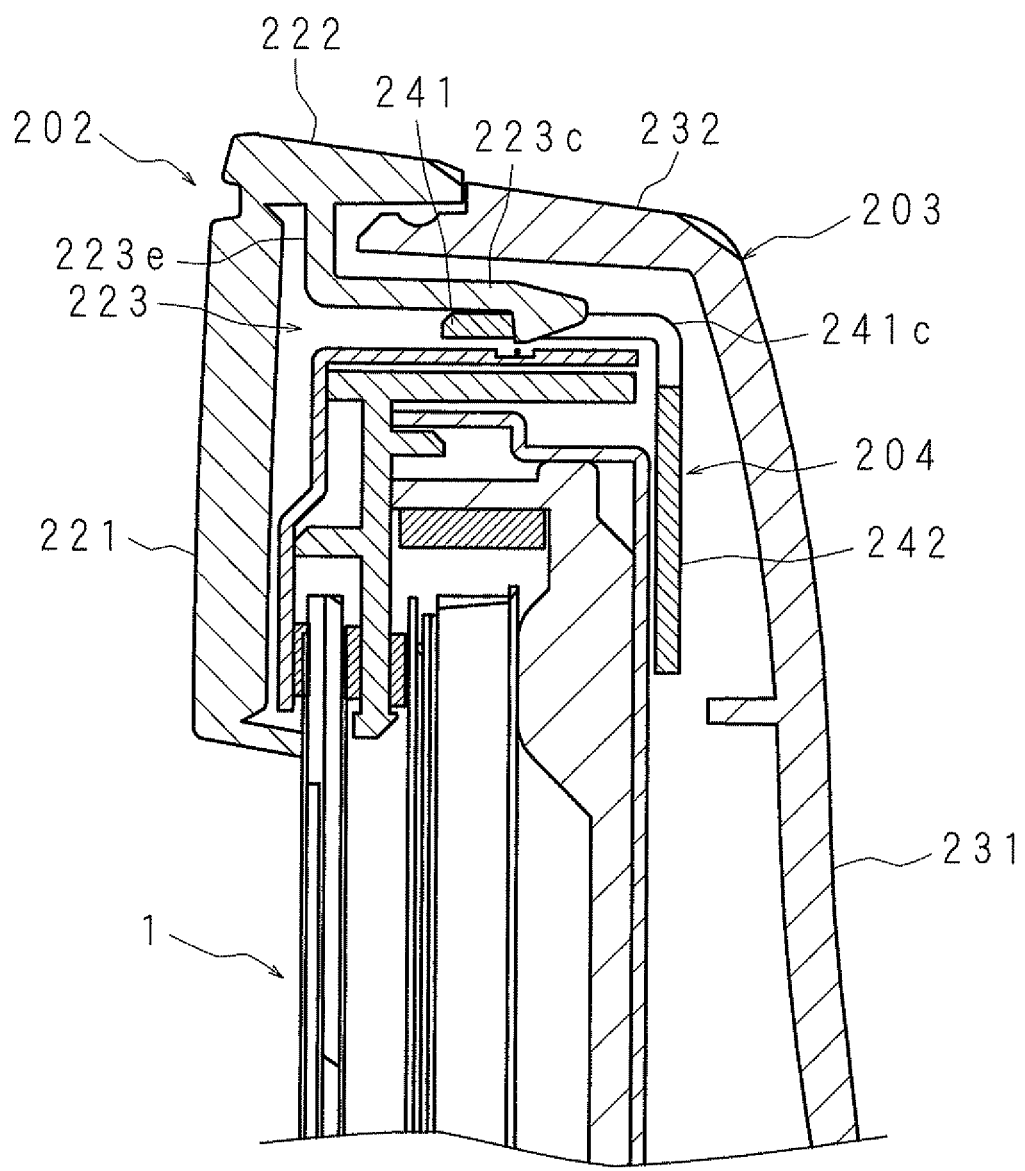
FIG. 18 is an enlarged side cross-sectional view showing a main part of a display device according to a modified example 2.

FIG. 18 is an enlarged side cross-sectional view showing a main part of the display device according to the modified example 2. The display device according to the modified example 2 includes a panel module 1, a front cabinet 202 and a back cabinet 203, as the embodiment. The back cabinet 203 is of the configuration identical to the embodiment or modified example 1, and the back cabinet 203 has a dish-shaped cover part 231 covering the back side of the panel module 1 and a rear frame part 232 extending to the periphery of the dish-shaped cover part 231. Further, the L-shaped fixing member 204 has an L shape as the modified example 1. The L-shaped fixing member 204 is provided with a latch plate 241 having a hole part 241c in which the flexible hook part 223c is latched and a contact plate 242 which is in contact with the back surface of the panel module 1. The latch plate 241 and the contact plate 242 are substantially a rectangular shape, respectively and the long edges are connected to each other.

The front cabinet 202 has a frame plate part 221 covering the periphery of the display surface side of the panel module 1. In addition, the front cabinet 202 has a front frame part 222 extending backward from the outer peripheral edge of the frame plate part 221 and covering the outer periphery of the panel module 1. Latch means 223 for latching the L-shaped fixing member 204 are installed between the back surface of the frame plate part 221 and the inner surface of the front frame part 222. A plurality of latch means 223 are installed on both sides and the upper portion in the lateral direction of the front cabinet 202, respectively. The latch means 223 is protruded toward the panel module 1 from the inner surface of the front frame part 222. In addition, the latch means 223 has a flexible hook part 223c backwardly extending from one position and a supporting member (not shown) supporting the L-shaped fixing member 204 in which the flexible hook part 223c is latched. The configuration of the supporting member is the same as the embodiment or the modified example 1. The base 223e of the flexible hook part 223c has elasticity and a hinge function pivoting about the base 223e in a direction close to or away from the panel module 1. The flexible hook part 223c has a hook-shaped portion at the front end thereof formed to latch to the L-shaped fixing member 204 as the embodiment or the modified example 1.

Furthermore, the length of the flexible hook part 223c is set to match the thinnest panel module 1 in consideration of variations due to the production error. That is, the dimensions in the forward and backward directions of the L-shaped fixing member 204 are determined so that the L-shaped fixing member 204 and the panel module 1 come into close contact to the extent that chattering due to a sound is not occurred when the front cabinet 202 is mounted on the panel module 1 with the smallest forward and backward widths using the L-shaped fixing member 204.

Figure 19:
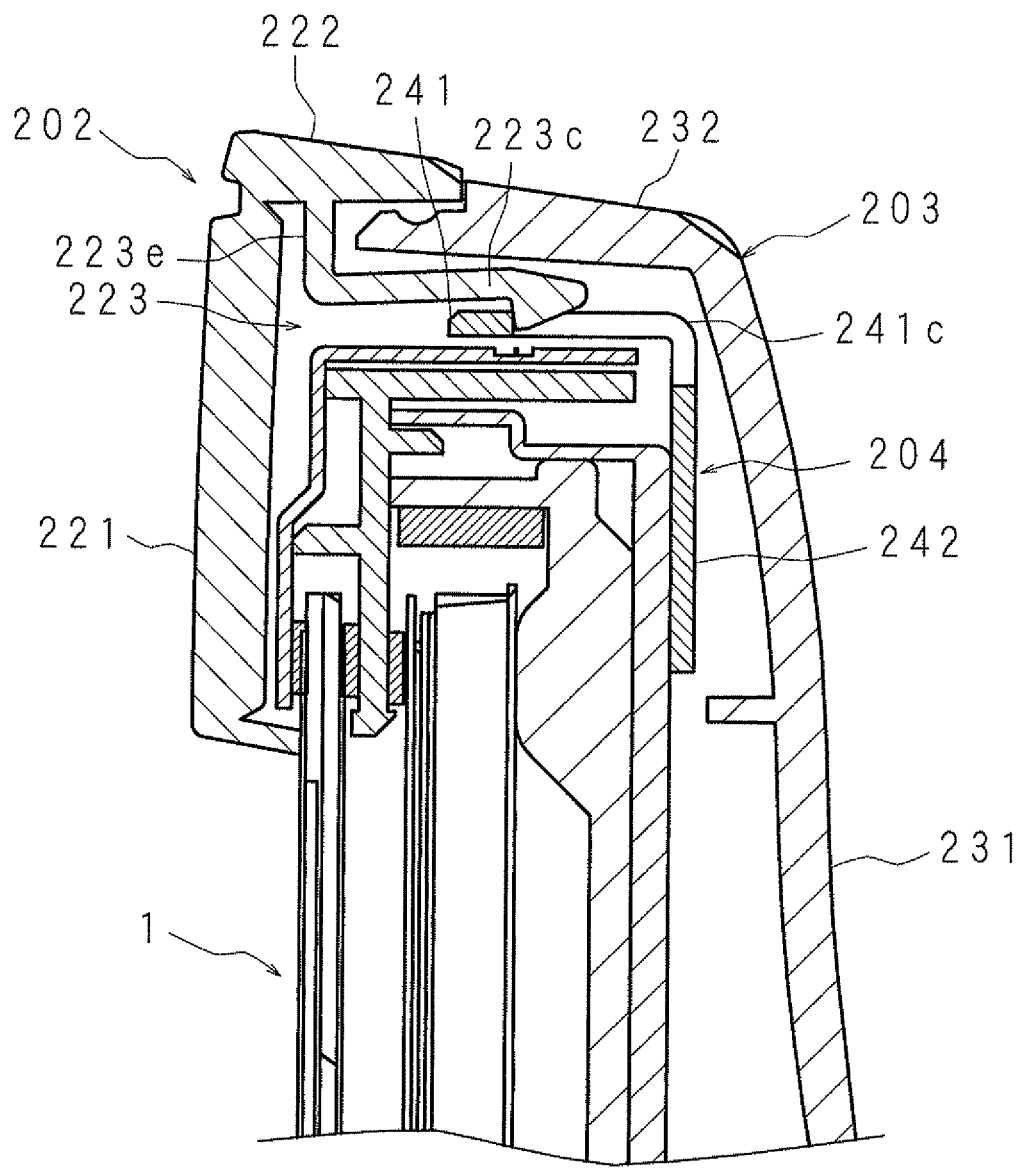
FIG. 19 is an enlarged side cross-sectional view showing the operation of the display device according to the modified example 2.

FIG. 19 is an enlarged side cross-sectional view showing the operation of the display device according to the modified example 2. As shown in FIG. 19, when the forward and backward widths of the panel module 1 become thick by a manufacturing error, the L-shaped fixing member 204 is positioned at right side (at back side) as compared with FIG. 18. However, since the L-shaped fixing member 204 has a hinge function, it pivots counterclockwise in FIG. 19 to be latched to the L-shaped fixing member 204. In this case, even if there is a dimensional error in the panel module 1, etc., the L-shaped fixing member 204 is in close contact with the back surface of the panel module 1, so that chattering due to the sound does not occur. Further, even if the L-shaped fixing member 204 is positioned at right (at back side) as compared with FIG. 18, the flexible hook part 223c does not need a large force for changing the hooking position for the L-shaped fixing member 204 while the L-shaped fixing member 204 is being mounted.

The display device according to the modified example 2 configured like this can prevent chattering due to the sound by making the L-shaped fixing member 204 come into close contact with the panel module 1 even if there is a dimensional error in the thickness of the panel module 1, etc., as shown in FIGS. 18 and 19. In addition, when the L-shaped fixing member 204 is mounted, it is not necessary to push the L-shaped fixing member 204 with a strong force, and it is possible to easily mount the L-shaped fixing member 204.

MODIFIED EXAMPLE 3

Figure 20:
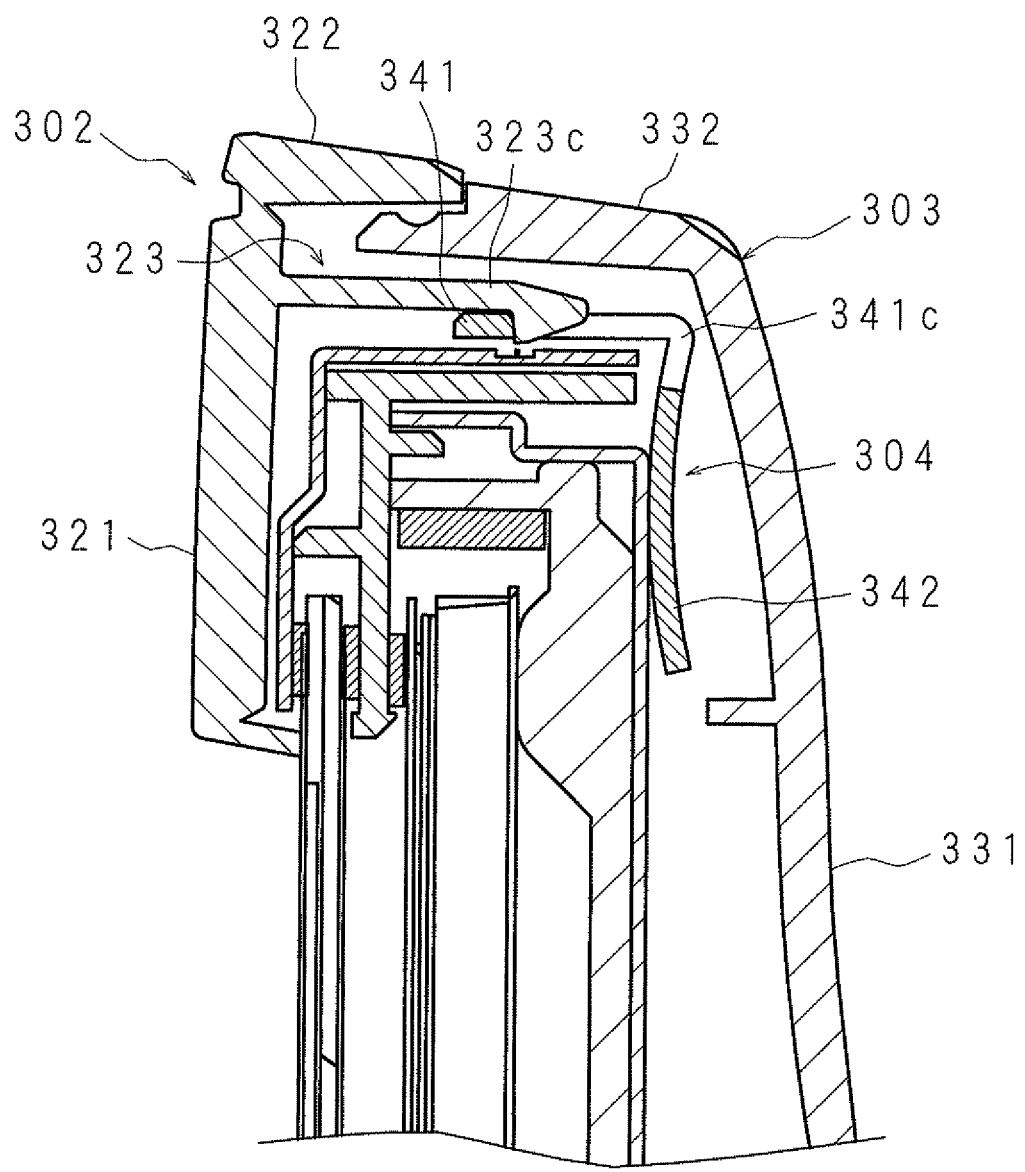
FIG. 20 is an enlarged side cross-sectional view showing a main part of a display device according to a modified example 3.

FIG. 20 is an enlarged side cross-sectional view showing a main part of a display device according to the modified example 3. The display device according to the modified example 3 includes a panel module 1, a front cabinet 302 and a back cabinet 303 like the embodiment. The back cabinet 303 is configured as the embodiment or the modified example 1, and the back cabinet 303 has a dish-shaped cover part 331 covering the back side of the panel module 1 and a rear frame part 332 extending to the periphery of the dish-shaped cover part 331.

The L-shaped fixing member 304 has an L shape as the modified example 1. In addition, the L-shaped fixing member 304 includes a latch plate 341 having a hole part 341c to which a flexible hook part 323c is latched and a contact plate 342 which is in contact with the back surface of the panel module 1. The latch plate 341 and the contact plate 342 are substantially a rectangular shape, respectively, and the long edges thereof are connected to each other. However, the contact plate 342 is curved such that the back side becomes concave. Therefore, the contact plate 342 and the back side of the panel module 1 come into linear contact.

The front cabinet 302 has a frame plate part 321 covering the periphery of the display surface side of the panel module 1. In addition, the front cabinet 302 has a front frame part 322 extending backward from the outer peripheral edge of the frame plate part 321 and covering the outer periphery of the panel module 1. Latch means 323 for latching the L-shaped fixing member 304 are installed between the back surface of the frame plate part 321 and the inner surface of the front frame part 322. The configuration of the flexible hook part 323c of the latch means 323 is the same as the embodiment. The length of the flexible hook part 323c is set to match the thinnest panel module 1 in consideration of variations due to the production error. That is, the dimensions in the forward and backward directions of the L-shaped fixing member 304 are determined so that the L-shaped fixing member 304 and the panel module 1 come into close contact to the extent that chattering due to a sound is not occurred when the front cabinet 302 is mounted on the panel module 1 with the smallest forward and backward widths using the L-shaped fixing member 304.

Figure 21:
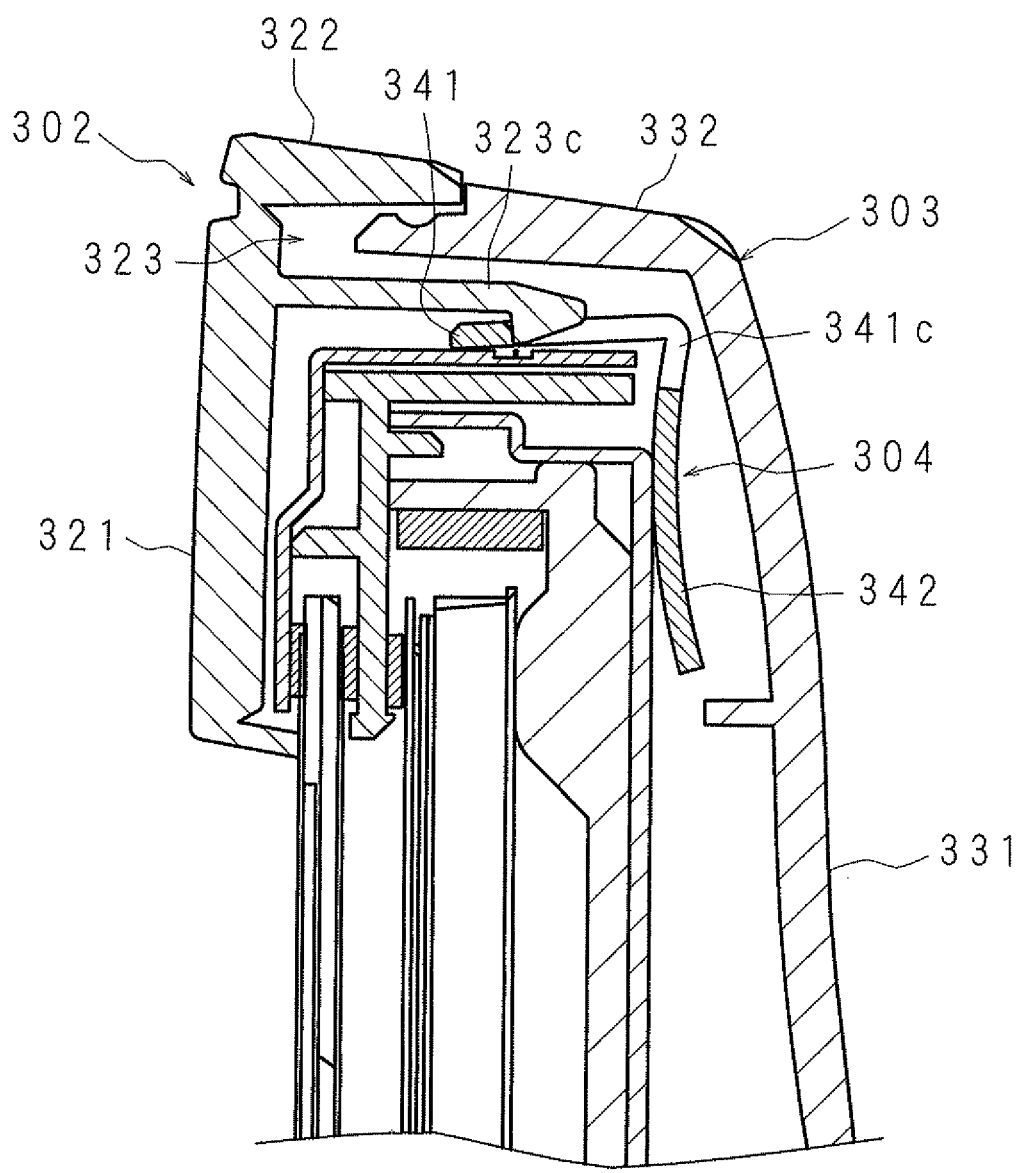
FIG. 21 is an enlarged side cross-sectional view showing the operation of the display device according to the modified example 3.

FIG. 21 is an enlarged side cross-sectional view showing the operation of the display device according to the modified example 3. As shown in FIG. 21, when the forward and backward widths of the panel module 1 become thick by a manufacturing error, the L-shaped fixing member 304 is positioned at right side (at back side) as compared with FIG. 20. However, the L-shaped fixing member 304 pivots counterclockwise in FIG. 21 to be latched to the L-shaped fixing member 304. In this case, even if there is a dimensional error in the panel module 1, etc., the L-shaped fixing member 304 contacts the back side of the panel module 1 in a linear contact manner, so that chattering due to the sound does not occur. Further, even if the L-shaped fixing member 304 is positioned at right side (at back side) as compared with FIG. 20, the L-shaped fixing member 304 does not need a large force for changing the hooking position for the flexible hook part 323c while the L-shaped fixing member 304 is being mounted.

The display device according to the modified example 3 configured like this can prevent chattering due to the sound by making the L-shaped fixing member 304 come into close contact with the panel module 1 even if there is a dimensional error in the thickness of the panel module 1, etc., as shown in FIGS. 20 and 21. Further, when the L-shaped fixing member 304 is mounted, it is not necessary to push the L-shaped fixing member 304 with a strong force, and it is possible to easily mount the L-shaped fixing member 304.

MODIFIED EXAMPLE 4

Figure 22:
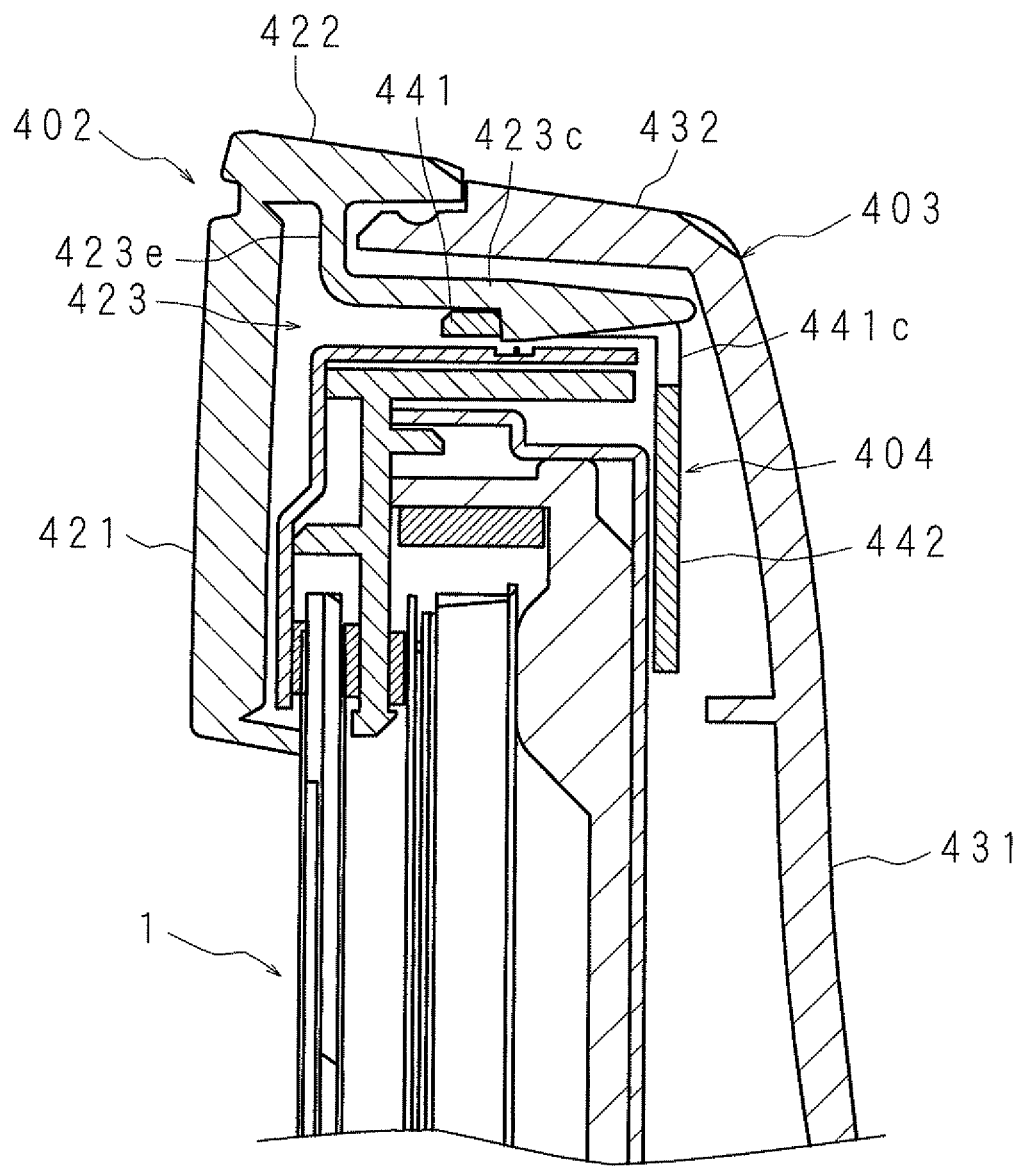
FIG. 22 is an enlarged side cross-sectional view showing a main part of a display device according to a modified example 4.

FIG. 22 is an enlarged side cross-sectional view showing a main part of a display device according to the modified example 4. The display device according to the modified example 4 includes a panel module 1, a front cabinet 402 and a back cabinet 403 as the embodiment. The back cabinet 403 is configured as the embodiment or the modified example 1, and has a dish-shaped cover part 431 covering the back side of the panel module 1 and a rear frame part 432 extending to the periphery of the dish-shaped cover part 431. The front cabinet 402 has a frame plate part 421 covering the periphery of the display surface side of the panel module 1. In addition, the front cabinet 402 has a front frame part 422 extending backward from the outer peripheral edge of the frame plate part 421 and covering the outer periphery of the panel module 1. Latch means 423 for latching the L-shaped fixing member 404 are installed on the back surface of the frame plate part 421 and the inner surface of the front frame part 422. The configuration of the flexible hook part 423c of the latch means 423 is the same as the embodiment or each of the modified examples. However, the forward and backward dimensions of the flexible hook part 423c are configured such that the front end of the flexible hook part 423c is positioned at back side from the L-shaped fixing metal fixed on the panel module 1.

Further, the L-shaped fixing member 404 has an L shape as in the modified example 1. In addition, the L-shaped fixing member 404 is provided with a latch plate 441 having a hole part 441c to which the flexible hook part 423c is latched and a contact plate 442 which is in contact with the back surface of the panel module 1.

The display device according to the modified example 4 configured like this has a front end of the flexible hook part 423c protruded toward the back side from the panel module 1. Therefore, if the panel module 1 is removed from the front cabinet 402 to perform maintenance, the front end of the flexible hook part 423c can be easily seen. In addition, since it is easy to hook a finger around the front end of the flexible hook part 423c, the panel module 1 can be easily removed.

As this description may be embodied in several forms without departing from the spirit of essential characteristics thereof, the present embodiment is therefore illustrative and not restrictive, since the scope is defined by the appended claims rather than by the description preceding them, and all changes that fall within metes and bounds of the claims, or equivalence of such metes and bounds thereof are therefore intended to be embraced by the claims.

As this invention may be embodied in several forms without departing from the spirit of essential characteristics thereof, the present embodiments are therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

The invention claimed is:

1. A display device, comprising:
    a panel module having a display surface on a front side of the panel module;
    a front cabinet surrounding a peripheral edge part of the panel module;
    a back cabinet covering a back side of the panel module;
    a flexible hook part protruded toward the back cabinet from an inner surface of the front cabinet; and
    an L-shaped fixing member fixing the front cabinet to the panel module, which has an L shape when viewed from a side and includes a latch plate having a hole part in which the flexible hook part is latched and a contact plate which is in contact with a back surface of the panel module,
    wherein the L-shaped fixing member is removable from the flexible hook part, and
    the panel module includes a liquid crystal panel, a backlight device disposed on the back side of the liquid crystal panel, and a holding frame which integrally holds the liquid crystal panel and the blacklight device.

2. The display device according to claim 1,
    wherein the front cabinet includes a supporting member supporting the L-shaped fixing member in which the flexible hook part is latched.

3. The display device according to claim 2,
    wherein two supporting members are installed on both sides of the flexible hook part along the panel module facing the flexible hook part and configured to sandwich the latch plate to which the flexible hook part is latched together with the flexible hook part, and
    the supporting member includes a protruded piece protruded from the latch plate along the panel module facing the latch plate and a positioning protrusion which is protruded toward the back cabinet from the inner surface of the front cabinet and is in contact with the protruded piece to position a mounting position of the L-shaped fixing member.

4. The display device according to claim 3,
    wherein the contact plate includes a contact convex part which is in contact with the back surface of the panel module, and
    the contact convex part and a portion to which the flexible hook part is latched are separated in a direction along the peripheral edge part of the panel module.

5. The display device according to claim 3,
wherein the positioning protrusion includes a first protruding strip restricting the L-shaped fixing member from moving in a direction along the peripheral edge part of the panel module when the L-shaped fixing member is latched to the flexible hook part and a second protruding strip restricting the L-shaped fixing member from moving toward the back cabinet when the L-shaped fixing member is latched to the flexible hook part.

6. The display device according to claim 5,
wherein the contact plate includes a contact convex part which is in contact with the back surface of the panel module, and
the contact convex part and a portion to which the flexible hook part is latched are separated in a direction along the peripheral edge part of the panel module.

7. The display device according to claim 1,
wherein the back cabinet includes a restriction part restricting the flexible hook part from bending in a direction of unhooking from the hole part of the latch plate.

8. The display device according to claim 7,
wherein the front cabinet includes a supporting member supporting the L-shaped fixing member in which the flexible hook part is latched.

9. The display device according to claim 8,
wherein two supporting members are installed on both sides of the flexible hook part along the panel module facing the flexible hook part and configured to sandwich the latch plate to which the flexible hook part is latched together with the flexible hook part, and
the supporting member includes a protruded piece protruded from the latch plate along the panel module facing the latch plate and a positioning protrusion which is protruded toward the back cabinet from the inner surface of the front cabinet and is in contact with the protruded piece to position a mounting position of the L-shaped fixing member.

10. The display device according to claim 9,
Wherein the contact plate includes a contact convex part which is in contact with the back surface of the panel module, and
the contact convex part and a portion to which the flexible hook part is latched are separated in a direction along the peripheral edge part of the panel module.

11. The display device according to claim 9,
wherein the positioning protrusion includes a first protruding strip restricting the L-shaped fixing member from moving in a direction along the peripheral edge part of the panel module when the L-shaped fixing member is latched to the flexible hook part and a second protruding strip restricting the L-shaped fixing member from moving toward the back cabinet when the L-shaped fixing member is latched to the flexible hook part.

12. The display device according to claim 11,
wherein the contact plate includes a contact convex part which is in contact with the back surface of the panel module, and
the contact convex part and a portion to which the flexible hook part is latched are separated in a direction along the peripheral edge part of the panel module.

13. The display device according to claim 1, further comprising:
a contact member which is installed laterally and vertically at an inner side from the flexible hook part of the front cabinet and contacts with the outer periphery of the panel module.

14. The display device according to claim 1,
wherein the flexible hook parts are installed on both sides and an inside of the upper portion of the front cabinet.

15. The display device according to claim 1,
wherein the front cabinet includes a frame plate part which covers the periphery of the display surface side of the panel module and a front frame part which extends backward from the outer peripheral edge of the frame plate part and covers the outer periphery of the panel module, and
the flexible hook part is protruded from an inner surface of the front frame part and is configured to be bent close to and away from the panel module.

16. The display device according to claim 1,
wherein the contact plate is curved such that the panel module side of the contact plate is protruded.

17. The display device according to claim 1,
wherein the flexible hook part has a front end which is positioned backward from the panel module.

18. A television receiver comprising:
the display device according to claim 1; and
a receiving unit receiving a video signal,
wherein the display device is configured to display an image based on the video signal received by the receiving unit.

* * * * *